US011960970B2

(12) United States Patent
Dial et al.

(10) Patent No.: US 11,960,970 B2
(45) Date of Patent: Apr. 16, 2024

(54) STRATEGIC PAUSING FOR QUANTUM STATE LEAKAGE MITIGATION

(71) Applicant: International Business Machines Corporation, Armonk, NY (US)

(72) Inventors: Oliver Dial, Yorktown Heights, NY (US); Antonio Corcoles-Gonzalez, Mount Kisco, NY (US); Maika Takita, Croton-on-Hudson, NY (US); David C. Mckay, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 777 days.

(21) Appl. No.: 17/096,170

(22) Filed: Nov. 12, 2020

(65) Prior Publication Data

US 2022/0147855 A1 May 12, 2022

(51) Int. Cl.
*G06N 10/00* (2022.01)
*G01R 31/52* (2020.01)

(52) U.S. Cl.
CPC ............. *G06N 10/00* (2019.01); *G01R 31/52* (2020.01)

(58) Field of Classification Search
None
See application file for complete search history.

(56) References Cited

U.S. PATENT DOCUMENTS

| | | | |
|---|---|---|---|
| 10,055,690 B2 | 8/2018 | Andreev et al. | |
| 10,422,607 B2 | 9/2019 | Barends | |
| 10,680,617 B2 | 6/2020 | Rylov | |
| 2019/0042968 A1* | 2/2019 | Lampert | H01L 29/66439 |

FOREIGN PATENT DOCUMENTS

| | | |
|---|---|---|
| CN | 109004989 | 12/2018 |
| EP | 2264653 | 12/2010 |

(Continued)

OTHER PUBLICATIONS

Varbanov B M et al: "Leakage detection for a transmon-based surface code", npj Quantum Information (2020) 6:102; https://doi.org/10.1038/s41534-020-00330-w; https://www.nature.com/articles/s41534-020-00330-w (Year: 2020).*

(Continued)

*Primary Examiner* — Xuyang Xia
(74) *Attorney, Agent, or Firm* — Amin, Turocy & Watson, LLP

(57) ABSTRACT

Systems and techniques that facilitate strategic pausing for quantum state leakage mitigation are provided. In various embodiments, a system can comprise a detection component that can detect a quantum state leakage associated with one or more qubits. In various aspects, the system can further comprise a pause component that can, in response to detecting the quantum state leakage, generate a time pause prior to execution of a quantum circuit on the one or more qubits. In various embodiments, the pause component can generate the time pause after execution of a previous quantum circuit on the one or more qubits, where the quantum state leakage arises during the execution of the previous quantum circuit. In some cases, the quantum state leakage can decay during the time pause.

20 Claims, 14 Drawing Sheets

(56) References Cited

FOREIGN PATENT DOCUMENTS

| | | |
|---|---|---|
| WO | 2019077296 | 4/2019 |
| WO | 2019152019 | 8/2019 |

OTHER PUBLICATIONS

Li-Hua Zhang et al. "Directly measuring the concurrence of atomic two-qubit states through the detection of cavity decay" published on The European Physical Journal D, (Eur. Phys. J. D (2014) 68: 109 DOI: 10.1140/epjd/e2014-40656-y) (Year: 2014).*

Examination Report No. 1 received for Australian Patent Application Serial No. 2021378062 dated Jul. 20, 2023, 3 pages.

International Search Report and Written Opinion received for International PCT Application Serial No. PCT/EP2021/081165 dated Mar. 1, 2022, 8 pages.

Varbanov et al., "Leakage Detection for a Transmon-Based Surface Code", arXiv, Feb. 17, 2020, pp. 1-21.

Mell et al., "The NIST Definition of Cloud Computing," Recommendations of the National Institute of Standards and Technology, NIST Special Publication 800-145, Sep. 2011, 7 pages.

Response dated Sep. 21, 2023 to the Communication Pursuant to Rules 161(1) and 162 for EP Application No. 21810327.3 dated Jun. 21, 2023.

* cited by examiner

STRATEGIC PAUSING FOR QUANTUM STATE LEAKAGE MITIGATION

BACKGROUND

The subject disclosure relates to quantum state leakages, and more specifically to strategic pausing for quantum state leakage mitigation.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that can facilitate strategic pausing for quantum state leakage mitigation are described.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise a detection component that can detect a quantum state leakage associated with one or more qubits. In various aspects, the computer-executable components can further comprise a pause component that can, in response to detecting the quantum state leakage, generate a time pause prior to execution of a quantum circuit on the one or more qubits. In various embodiments, the pause component can generate the time pause after execution of a previous quantum circuit on the one or more qubits, where the quantum state leakage arises during the execution of the previous quantum circuit. In some cases, the quantum state leakage can decay during the time pause.

According to one or more embodiments, the above-described system can be implemented as a computer-implemented method and/or computer program product.

DETAILED DESCRIPTION

Figure 1:
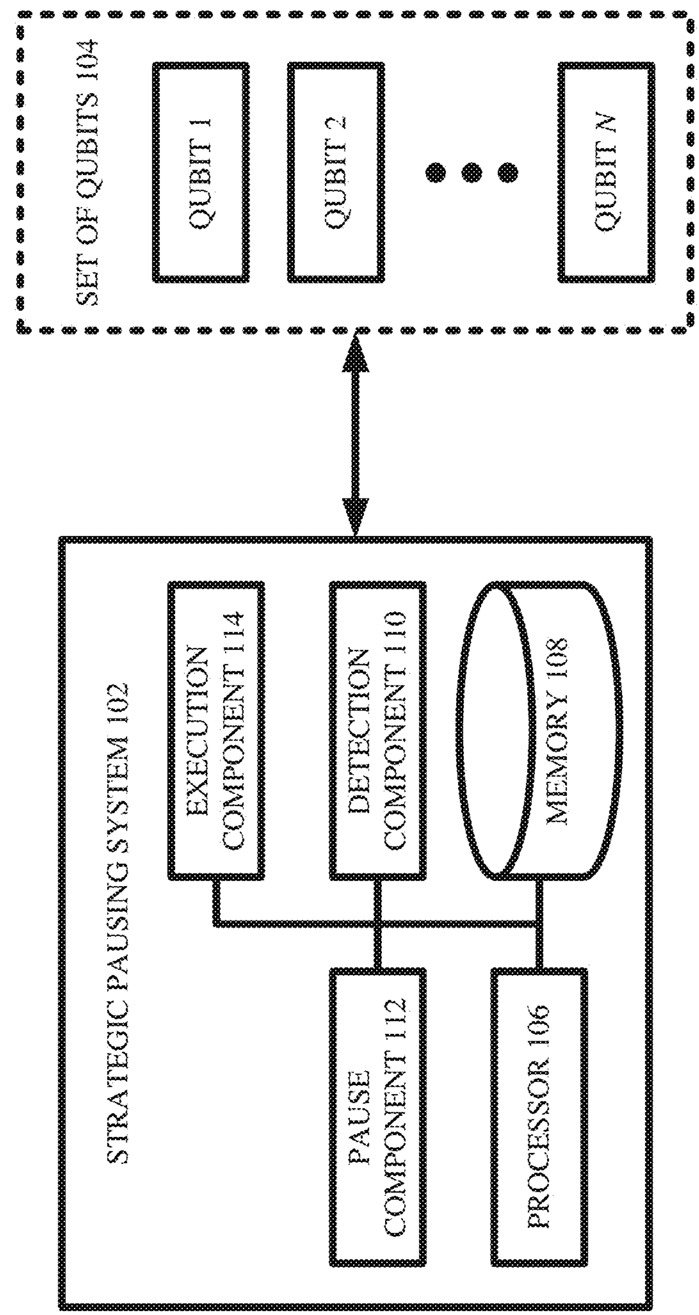
FIG. 1 illustrates a block diagram of an example, non-limiting system that facilitates strategic pausing for quantum state leakage mitigation in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In quantum computers, information is carried and/or represented via qubits (e.g., quantum binary digits). While a classical bit can be in one of two basis states (e.g., the state of a bit can be either 0 or 1), a qubit can be in a superposition of basis states (e.g., the state of a qubit can be represented as $\alpha|0\rangle+\beta|1\rangle$, where $|0\rangle$ represents the ground state of the qubit, where $|1\rangle$ represents the first excited state of the qubit, and where $\alpha$ and $\beta$ represent complex probability amplitudes). Qubits can be implemented at atomic scales (e.g., photon polarization can exhibit quantum behavior, electron spin can exhibit quantum behavior, nucleus spin can exhibit quantum behavior, quantum dots can exhibit quantum behavior) and/or at macroscopic scales (e.g., Josephson junctions can exhibit quantum behavior).

During quantum computing and/or quantum information processing, one or more quantum circuits can be executed on a set of qubits (e.g., a set of qubits can include one or more qubits). A quantum circuit can be a string of one or more quantum gates that operate on and/or transform the states of the set of qubits. Specifically, the set of qubits can be initialized with known states, a quantum circuit can be executed on the set of qubits thereby transforming their states, and the transformed states of the set of qubits can be measured via any suitable quantum readout technique. The transformed states of the set of qubits can then be reset (e.g., re-initialized) prior to execution of another quantum circuit on the set of qubits. In order to increase an execution rate of the quantum circuits, and hence the rate at which the outputs are sampled, it can be desired to execute two or more quantum circuits on the set of qubits closely together in time; that is, to increase a repetition rate of the quantum circuits. In order to facilitate such increased repetition rates, quantum state resets can be performed, for example, via microwave sideband techniques and/or via measurement-and-feed-forward techniques.

Generally, in quantum computing and/or quantum information processing, a qubit can be assumed to have two basis states: a ground state and a first excited state. In reality, however, a qubit can sometimes have more than two basis states: a ground state, a first excited state, and one or more higher-order excited states (e.g., a second excited state, a third excited state, an m-th excited state for any suitable integer m>1). In such case, the ground state and the first excited state of the qubit can be considered as computational basis states (e.g., states that are utilized to perform quantum computations), and the higher-order excited states can be considered as leaked states (e.g., states that are not utilized to perform quantum computations). That is, when the qubit is in a state other than the ground state or the first excited state, a quantum state leakage can be said to have occurred. Although the herein disclosure mainly discusses embodiments where the computational basis states include only the ground state and the first excited state and where the leaked states include excited states that are of higher order than the first excited state, such embodiments are non-limiting examples. In various other embodiments, the computational basis states can include any suitable number of states (e.g., the ground state, the first excited state, the second excited state, up to the p-th excited state for any suitable positive integer p), and the leaked states can include the remaining possible states of the qubit (e.g., the (p+1)-th excited state, the (p+2)-th excited state, up to the m-th excited state, where m>p and where m represents the total number of possible states of the qubit). Note that a quantum state leakage is distinct from a physical electric charge leakage (e.g., a quantum state leakage pertains to the state of a qubit; it does not pertain to the permeance of an electric charge and/or current beyond some physical barrier that is used in the physical construction of a qubit).

A quantum state leakage can occur (e.g., a qubit can become leaked) during the execution of a quantum circuit and/or during quantum readout. When a quantum state leakage occurs, it can corrupt the execution of subsequent quantum circuits, which can be undesirable. Specifically, when a quantum state leakage occurs, reset techniques (e.g., such as microwave sideband and/or measurement-and-feed-forward) can fail to fully re-initialize the states of the set of qubits, which can cause subsequent quantum circuits to execute inaccurately and/or improperly on the set of qubits. Such problems can become exacerbated at high repetition rates; in particular, as the repetition rate increases, quantum state leakages can become more likely to negatively affect subsequent quantum circuits, thereby resulting in a drop in fidelity. Thus, systems and/or techniques that can ameliorate the technical problem of quantum state leakages can be desirable.

Some systems and/or techniques attempt to actively prevent and/or mitigate the formation of quantum state leakages by applying ancillary electronic pulses to the set of qubits before, during, and/or after the execution of a quantum circuit on the set of qubits and/or before, during, and/or after measurement of the states of the set of qubits. However, such pulses add overhead costs, require frequent calibration to ensure proper functioning, and inject additional noise that can negatively affect coherence and/or fidelity of the set of qubits. In other words, systems and/or techniques that utilize pulses to actively prevent and/or mitigate quantum state leakages introduce many disadvantages of their own.

Various embodiments of the invention can address one or more of these technical problems. Specifically, various embodiments of the invention can provide systems and/or techniques that can facilitate strategic pausing for quantum state leakage mitigation. In other words, various embodiments of the invention can be considered as a quantum computing tool (e.g., computer-implemented software) that can facilitate high repetition rates of quantum circuits on a set of qubits while also helping to prevent quantum state leakages in the set of qubits from corrupting subsequent executions of quantum circuits. In various aspects, such a quantum computing tool can measure, via any suitable quantum readout techniques, the states of the set of qubits in order to detect a quantum state leakage associated with the set of qubits. If the quantum computing tool detects a quantum state leakage (e.g., if the quantum computing tool determines that at least one qubit in the set of qubits is in a state other than the ground state or the first excited state), the quantum computing tool can generate a strategic time pause prior to the execution of a next quantum circuit on the set of qubits. In various aspects, the quantum state leakage can decay back to a non-leaked state (e.g., the ground state and/or the first excited state) during the strategic time pause. In various instances, once the strategic time pause elapses, the quantum computing tool can execute, cause to be executed, and/or otherwise facilitate the execution of the next quantum circuit. In various cases, if the quantum computing tool does not detect a quantum state leakage (e.g., if the quantum computing tool determines that no qubit in the set of qubits is in a state other than the ground state or the first excited state), the quantum computing tool can refrain from generating the strategic time pause and can execute, cause to be executed, and/or otherwise facilitate the execution of the next quantum circuit immediately (e.g., without pausing).

In various instances, strategic pausing as described herein can prevent fidelity losses associated with quantum state leakages. Specifically, if the quantum computing tool determines that at least one qubit of the set of qubits is in a leaked state, the quantum computing tool can stall the execution of the next quantum circuit on the set of qubits, so that the leaked state has time to naturally decay back to a non-leaked state. Thus, the next quantum circuit can be executed on the set of qubits after the leaked state decays back to a non-leaked state, which means that the next quantum circuit can be uncorrupted by the leaked state. Because the leaked state no longer exists at the time of execution of the next quantum circuit (e.g., the leaked state can have decayed during the strategic time pause), fidelity of the next quantum circuit can be undiminished by the leaked state.

Moreover, in various aspects, strategic pausing as described herein can further result in increased quantum circuit repetition rates. Intuition might suggest the opposite: that waiting for a leaked state to decay before executing the next quantum circuit would decrease repetition rates. After all, high repetition rates can be achieved by sequentially executing quantum circuits on the set of qubits as close in time as is feasible, and so inserting pauses between the execution of sequential quantum circuits would thus be expected to lessen repetition rates. However, the inventors of various embodiments of the invention recognized that such pauses need not be inserted before the execution of every quantum circuit in a sequence of quantum circuits. Instead, the inventors of various embodiments of the invention recognized that the average repetition rate associated with the sequence of quantum circuits can be increased, without a corresponding loss of fidelity, by inserting a pause when a quantum state leakage is detected and by not inserting a pausing when a quantum state leakage is not detected (e.g., a pause can allow a leaked state to decay back to a non-leaked state; if no quantum state leakage is detected, a pause can be unnecessary because there is no leaked state to decay).

In various instances, a quantum computing tool in accordance with various embodiments of the invention can be electronically integrated with a set of qubits and can comprise a detection component, a pause component, and an execution component.

In various aspects, a prior quantum circuit can have been executed on the set of qubits. In various instances, the detection component of the quantum computing tool can measure the states of the set of qubits (e.g., can determine what state each qubit of the set of qubits is currently in). In various aspects, the detection component can facilitate such measurement via any suitable quantum state readout techniques and/or apparatuses. For example, in some cases, the detection component can be integrated with any suitable number of microwave readout resonators that can measure and/or detect the states of superconducting qubits in the set of qubits. As another example, in some cases, the detection component can be integrated with any suitable number of photonic sensors that can measure and/or detect the states of spin-based qubits in the set of qubits. It should be appreciated that these are mere examples of quantum state readout apparatuses/techniques and are non-limiting. In various aspects, any suitable combinations of any other suitable quantum state readout apparatuses/techniques can be implemented by the detection component.

Moreover, as those having ordinary skill in the art will appreciate, some quantum state readout apparatuses/techniques can binarily distinguish between ground states and excited states (e.g., when such apparatuses/techniques are implemented, the measurement of a first excited state would yield the same results as the measurement of a higher-order excited state), while other quantum state readout apparatuses/techniques can granularly distinguish between different levels of excited states (e.g., when such apparatuses/techniques are implemented, the measurement of a first excited state would yield different results than the measurement of a higher-order excited state). In various embodiments, any of such quantum state readout apparatuses/techniques can be implemented by the detection component. In various aspects, if the implemented quantum state readout apparatuses/techniques can distinguish between different levels of excited states, a quantum state leakage can be determined/inferred to have occurred if any qubit of the set of qubits is in an excited state that is above the first excited state. In various instances, if the implemented quantum state readout apparatuses/techniques can only binarily distinguish between ground states and excited (e.g., non-ground) states, a quantum state leakage can be determined/inferred to have occurred if any qubit is in an excited (e.g., non-ground) state. In various other instances, if the implemented quantum state readout apparatuses/techniques can only binarily distinguish between ground states and excited (e.g., non-ground) states, then one or more reset operations can be executed after the execution of the previous quantum circuit and before the measurement by the detection component, and a quantum state leakage can be determined/inferred to have occurred if any qubit is in an excited (e.g., non-ground) state after the execution of the one or more reset operations (e.g., if the one or more reset operations fail to take the set of qubits back to ground states, it can be inferred that a quantum state leakage has occurred).

In various instances, the pause component of the quantum computing tool can take action and/or can refrain from taking action based on the quantum state measurements obtained by the detection component. For instance, if the detection component determines and/or infers that there is a quantum state leakage in the set of qubits, the pause component can generate a strategic time pause prior to execution of a next quantum circuit on the set of qubits, thereby stalling the execution of the next quantum circuit. On the other hand, if the detection component determines and/or infers that there is not a quantum state leakage in the set of qubits, the pause component can refrain from generating the strategic time pause, thereby not stalling the execution of the next quantum circuit. In various aspects, the strategic time pause can be a span of time during which the next quantum circuit is not executed. During such span of time, the quantum state leakage detected by the detection component can naturally decay and/or relax back to a non-leaked state (e.g., to decay and/or relax from a higher-order excited state back to the first excited state or to the ground state). In various instances, the strategic time pause can have any suitable duration and/or length that allows the quantum state leakage to decay and/or relax back to a non-leaked state. In various aspects, the duration of the strategic time pause can be greater than and/or equal to a coherence time associated with the set of qubits, where the coherence time of a qubit can be the amount of time (e.g., which can be on the order of milliseconds and/or microseconds) during which a quantum state can persist before being changed due to interactions with the qubit's external environment. In various instances, the strategic time pause can be of a same order of magnitude as the coherence time associated with the set of qubits (e.g., where an order of magnitude can be analogous to a power of 10). So, for example, if the set of qubits have coherence times of T microseconds for any suitable positive number T, the duration of the strategic time pause can be greater than and/or equal to T and can be less than and/or equal to 10 T (e.g., can be up to one order of magnitude greater than T). In various cases, however, the strategic time pause can be more than one order of magnitude greater than the coherence time associated with the set of qubits.

As mentioned above, in various aspects, the detection component of the quantum computing tool can distinguish between different levels of excited states. In such cases, the pause component can vary and/or modulate the duration of the strategic time pause based on the magnitude, order, and/or level of the maximum excited state detected by the detection component. In particular, the amount of time needed for an excited state to naturally decay and/or relax back to the ground state or to the first excited state can increase with the magnitude, order, and/or level of the excited state (e.g., a third excited state can take longer to decay/relax than a second excited state, a fourth excited state can take longer to decay/relax than a third excited state). In various aspects, the pause component can have any suitable form of electronic access to a decay look-up table, which can correlate different magnitudes, orders, and/or levels of excited states to different decay times. In various aspects, such decay times can be obtained through routine experimentation (e.g., a qubit can be placed in a second excited state in a laboratory setting and the amount of time it takes for the qubit to decay back to the first excited state and/or to the ground state can be recorded; similarly, the qubit can be placed in a third excited state in the laboratory setting and the amount of time it takes for the qubit to decay back to the first excited state and/or to the ground state can be recorded). In this way, the pause component can tailor the length/duration of the strategic time pause based on the magnitude of the quantum state leakage detected by the detection component (e.g., the more severe the quantum state leakage, the more time that can be needed for the quantum state leakage to dissipate).

In various aspects, the execution component of the quantum computing tool can execute, cause to be executed, and/or otherwise facilitate the execution of the next quantum circuit on the set of qubits after the strategic time pause has elapsed. As mentioned above, the detection component can determine and/or infer that there exists a quantum state leakage associated with the set of qubits (e.g., can determine and/or infer that at least one qubit in the set of qubits is in a leaked state). In such case, the pause component can determine an amount of time which would allow the quantum state leakage to naturally decay and/or relax back to a non-leaked state, and such amount of time can be considered as the strategic time pause. In various instances, the pause component can implement the strategic time pause by transmitting an electronic command to the execution component, where the electronic command instructs the execution component to prevent and/or forestall, for the duration of the strategic time pause, the execution of the next quantum circuit. In various aspects, the electronic command can instruct the execution component to execute, cause to be executed, and/or otherwise facilitate the execution of the next quantum circuit once the strategic time pause elapses. At such time, the quantum state leakage can have naturally decayed and/or relaxed back to a non-leaked state, and so the execution of the next quantum circuit on the set of qubits can be uncorrupted by the quantum state leakage. If the detection component determines and/or infers that there is not a quantum state leakage associated with the set of qubits, the pause component can transmit to the execution component an electronic command that instructs the execution component to execute, cause to be executed, and/or otherwise facilitate the execution of the next quantum circuit on the set of qubits without waiting/stalling.

To summarize some of the above, the detection component can measure the states of the set of qubits to determine whether or not a quantum state leakage has occurred. If the detection component concludes that a quantum state leakage has occurred, the pause component can generate a strategic time pause and can instruct the execution component to wait for the duration of the strategic time pause before executing the next quantum circuit on the set of qubits. Once the strategic time pause elapses, the execution component can proceed with the execution of the next quantum circuit. If the detection component concludes that no quantum state leakage has occurred, the pause component can refrain from generating the strategic time pause, and the execution component can proceed with the execution of the next quantum circuit immediately. By pausing when a leaked state is detected and by not pausing when a leaked state is not detected (e.g., hence the name "strategic pausing"), quantum circuits can be executed on the set of qubits at a high/fast average repetition rate without being corrupted by leaked states. This is certainly advantageous as compared to pausing before the execution of every single quantum circuit. Moreover, such strategic pausing does not require the implementation and/or calibration of leakage-mitigating pulses, and thus is even more advantageous.

To help clarify these advantages, consider the following non-limiting example. It should be appreciated that any numerical values presented in the following example are illustrative and non-limiting. Consider a 20-qubit device having a coherence time of 100 microseconds (e.g., although it is more complicated in the real-world, assume for purposes of this example that the coherence times of all levels/states of a qubit are the same). Furthermore, suppose that there is a 0.1% leakage rate during execution of quantum state measurements and a 0.01% leakage rate during execution of an entangling gate (e.g., a 2-qubit gate such as Controlled-NOT). Suppose that a quantum circuit involving all 20 qubits and involving an entangling gate depth of 10 is executed on the 20-qubit device, and suppose that a quantum state measurement is executed afterward for all 20 qubits. In such case, the probability of any given qubit leaking during the execution of the circuit and the measurement can be about 0.2% (e.g., the probability that the qubit leaks during only the measurement, given by $0.001*(1-0.0001)^{10}$, plus the probability that the qubit leaks during the measurement and during all the entangling gates, given by $0.001*0.0001^{10}$, plus the probability that the qubit leaks only during some combination of the entangling gates, given by $$\sum_{i=1}^{9}\binom{10}{i}*(1-0.001)*0.0001^{10-i}*(1-0.0001)^{i},$$

for a total of about 0.002 or 0.2%). Thus, the probability of running the circuit and the measurement with none of the 20 qubits leaking can be about 96% (e.g., $(1-0.002)^{20}$ is about 0.96), which means that at least one of the 20 qubits can have leaked after about 4% of the executions. Suppose that an entangling gate takes 200 nanoseconds to execute, and suppose that measuring the states of the 20 qubits takes a total of 10 microseconds. Thus, sequential execution of the circuit and the measurement can take a total of 12 microseconds (e.g., 200 nanoseconds per entangling gate for 10 entangling gates, plus 10 microseconds for measurement). In other words, if multiple of such circuit and measurement executions are implemented back-to-back, this can result in a repetition rate of 12 microseconds. Since each qubit can have a coherence time of 100 microseconds, any qubit that is in a leaked state can remain in the leaked state for about 8 repetitions (e.g., about 8 circuit and measurement repetitions that take 12 microseconds each can fit within a 100 microsecond time window). Therefore, when the leaked states are not addressed in some way, many subsequent circuit and measurement repetitions can be corrupted (e.g., as many as 30% of runs can be contaminated by leaked states in some cases), which is problematic.

Various embodiments of the invention can address this problem via strategic pausing. Specifically, a time pause that is long compared to the coherence time (e.g., greater than and of the same order of magnitude as the coherence time) can be inserted after the execution of a measurement that identifies a leaked state and before the execution of a subsequent circuit. For a coherence time of 100 microseconds, the time pause can, in some cases, be 500 microseconds. During such time pauses, any detected leaked states can naturally decay and/or relax back to non-leaked states, such that execution of the subsequent circuit is not corrupted by the leaked states. As mentioned above, this example can involve about 4% of runs having leaked states. Thus, a 500 microsecond time pause can be added to about 4% of runs and can be not added to the remaining 96% of runs, which can result in an average repetition rate of about 32 microseconds (e.g., 96% of circuit and measurement repetitions in this example do not involve leaked states and can thus take 12 microseconds, and 4% of circuit and measurement repetitions in this example involve leaked states and can thus take 512 microseconds, where 0.96*12+0.04*512=32). Note that an average repetition rate of 32 microseconds is very fast compared to pausing before every single circuit which would yield an average repetition rate of 512 microseconds. Moreover, note that, even though an average repetition rate of 32 microseconds is slightly slower than a repetition rate of 12 microseconds which would be achieved without any pauses at all, the implementation of strategic pausing ameliorates the problem of circuit corruption and/or contamination due to quantum state leakages (e.g., the implementation of time pauses allows detected leaks to decay and/or relax back to non-leaked states, so that such leaks do not taint the execution of subsequent circuits). Furthermore, as mentioned above, strategic pausing does not require the implementation and/or calibration of any additional electronic pulses which would otherwise add overhead costs, noise, and/or decoherence.

Various embodiments of the invention can be employed to use hardware and/or software to solve problems that are highly technical in nature (e.g., to facilitate strategic pausing for quantum state leakage mitigation), that are not abstract and that cannot be performed as a set of mental acts by a human. Further, some of the processes performed can be performed by a specialized computer (e.g., detecting, by a device operatively coupled to a processor, a quantum state leakage associated with one or more qubits; and generating, by the device and in response to detecting the quantum state leakage, a time pause prior to execution of a quantum circuit on the one or more qubits, wherein the generating the time pause occurs after execution of a previous quantum circuit on the one or more qubits, wherein the quantum state leakage arises during the execution of the previous quantum circuit, and wherein the quantum state leakage decays during the time pause). Such defined tasks are not typically performed manually by humans. Moreover, neither the human mind nor a human with pen and paper can detect leaked quantum states of a set of qubits and generate a time pause during which the leaked quantum states relax back to non-leaked states. Instead, various embodiments of the invention are inherently and inextricably tied to computer technology and cannot be implemented outside of a computing environment (e.g., quantum state leakages reduce fidelity of quantum computers, and quantum computing techniques that can ameliorate such loss of fidelity cannot be utilized in any practicable way outside of a quantum computing environment).

In various instances, embodiments of the invention can integrate into a practical application the disclosed teachings regarding strategic pausing for quantum state leakage mitigation. Indeed, as described herein, various embodiments of the invention, which can take the form of systems and/or computer-implemented methods, can be considered as a quantum computing tool that measures the states of a set of qubits in order to detect a quantum state leakage (e.g., in order to determine whether any qubit in the set of qubits is in a leaked state). If the quantum computing tool determines that a quantum state leakage has occurred, the quantum computing tool can stall the execution of a subsequent quantum circuit on the set of qubits for a particular period of time (e.g., for the duration of a strategic time pause). During such period of time, the quantum state leakage can naturally dissipate back to the ground state or to the first excited state, at which point the quantum state leakage no longer exists (e.g., at which point, the qubit is no longer in a leaked state). The quantum computing tool can then execute and/or otherwise cause to be executed the subsequent quantum circuit on the set of qubits. Since the quantum state leakage no longer exists at the time of execution of the subsequent quantum circuit, the subsequent quantum circuit can be uncorrupted by the quantum state leakage. By inserting such time pauses when quantum state leakages are detected and by not inserting such time pauses when quantum state leakages are not detected, quantum circuits can be executed on the set of qubits at an increased average repetition rate without a corresponding drop in fidelity and/or accuracy due to leaked states. In other words, various embodiments of the invention can improve the performance of quantum computing devices (e.g., can increase repetition rates and can decrease loss of fidelity). Systems and/or techniques that can facilitate increased repetition rates while also ameliorating the problem of quantum state leakages clearly constitute a concrete and tangible technical improvement in the field of quantum computing and/or quantum information processing.

Furthermore, various embodiments of the invention can control tangible, hardware-based, and/or software-based devices based on the disclosed teachings. For example, embodiments of the invention can measure/detect the states of tangible qubit devices, can determine based on such measurement/detection whether at least one of the tangible qubit devices is currently in a leaked state, can stall the execution of quantum circuits on such tangible qubit devices if at least one of the tangible qubit devices is in a leaked state, and/or can facilitate the execution of quantum circuits on such tangible qubit devices if none of the tangible qubit devices is in a leaked state. In other words, various embodiments of the invention can control and improve the performance of real-world and tangible qubit devices. Thus, embodiments of the invention constitute a concrete and tangible technical improvement in the field of quantum computing and/or quantum information processing.

It should be appreciated that the figures and the herein disclosure describe non-limiting examples of various embodiments of the invention.

FIG. 1 illustrates a block diagram of an example, non-limiting system 100 that can facilitate strategic pausing for quantum state leakage mitigation in accordance with one or more embodiments described herein. As shown, in various embodiments, a strategic pausing system 102 can be coupled via any suitable electronic connection (e.g., wired and/or wireless) to a set of qubits 104. The set of qubits 104 can comprise any suitable number of qubits (e.g., qubit 1, qubit 2, . . . , qubit n for any suitable positive integer n, as shown). In various aspects, the set of qubits 104 can include any suitable combinations of any suitable types of qubits (e.g., superconducting qubits, spin-based qubits, quantum dots). In various cases, a qubit in the set of qubits 104 can have multiple states: a ground state and a first excited state (which can be referred to as computational basis states) and higher-order excited states (which can be referred to as leaked states and/or leaked states). In various instances, it can be desired to perform quantum computing and/or quantum information processing by executing quantum circuits on the set of qubits 104 and correspondingly measuring the resulting states of the set of qubits 104. In various cases, faster execution of such quantum circuits on the set of qubits 104 (e.g., faster and/or higher repetition rates) can be desirable. However, such faster execution can be accompanied by a loss of fidelity and/or accuracy due to quantum state leakages associated with the set of qubits 104 (e.g., when one or more qubits of the set of qubits 104 is in a leaked state, reset techniques can become ineffective and/or the execution of subsequent quantum circuits can be corrupted). In various aspects, the strategic pausing system 102 can facilitate such faster execution of quantum circuits on the set of qubits 104 without such corresponding loss of fidelity and/or accuracy, by implementing strategic pauses.

In various embodiments, the strategic pausing system 102 can comprise a processor 106 (e.g., computer processing unit, microprocessor) and a computer-readable memory 108 that is operably connected to the processor 106. The memory 108 can store computer-executable instructions which, upon execution by the processor 106, can cause the processor 106 and/or other components of the strategic pausing system 102 (e.g., detection component 110, pause component 112, execution component 114) to perform one or more acts. In various embodiments, the memory 108 can store computer-executable components (e.g., detection component 110, pause component 112, execution component 114), and the processor 106 can execute the computer-executable components.

In various embodiments, the strategic pausing system 102 can comprise an execution component 114. In various aspects, the execution component 114 can execute, cause to be executed, and/or otherwise facilitate in any suitable fashion the execution of one or more quantum circuits on the set of qubits 104. In various instances, as mentioned above, a quantum circuit can be a string of quantum gates (e.g., represented by unitary matrices) that can operate on and/or transform the states of the set of qubits 104. Quantum circuits can be combined sequentially via matrix multiplication and/or can be combined in parallel via tensor products (e.g., Kronecker products). In some cases, the execution component 114 can execute, cause to be executed, and/or otherwise facilitate the execution of quantum circuits on the set of qubits 104 by driving the set of qubits 104 with controlled and/or tuned electromagnetic signals (e.g., the execution component 114 can be integrated with any suitable quantum computing equipment such as waveguides and/or signal generators/modulators to generate and/or propagate such electromagnetic signals).

In various embodiments, the strategic pausing system 102 can comprise a detection component 110. In various aspects, the detection component 110 can read, measure, detect, and/or otherwise sense the states of the set of qubits 104. In various instances, the detection component 110 can facilitate such reading, measuring, detecting, and/or otherwise sensing by implementing and/or being electronically integrated with any suitable combinations of any suitable types of quantum readout apparatuses (e.g., the detection component 110 can have a dedicated quantum readout apparatus for each qubit in the set of qubits 104). For example, in various cases, the detection component 110 can implement and/or be electronically integrated with any suitable microwave readout resonators that can read, measure, detect, and/or otherwise sense the states of superconducting qubits that are included in the set of qubits 104. As another example, in various cases, the detection component 110 can implement and/or be electronically integrated with any suitable photonic sensors that can read, measure, detect, and/or otherwise sense the states of spin-based qubits that are included in the set of qubits 104. Those having ordinary skill in the art will appreciate that these are mere non-limiting examples of possible quantum readout apparatuses that can be incorporated in various embodiments. In various instances, any other suitable quantum readout apparatuses and/or quantum readout techniques can be implemented by the detection component 110.

By reading, measuring, detecting, and/or otherwise sensing the states of the set of qubits 104, the detection component 110 can determine whether there exists a quantum state leakage associated with the set of qubits 104. In various aspects, if the detection component 110 determines that at least one qubit of the set of qubits 104 is in a leaked state (e.g., is in a state other than the ground state or the first excited state), the detection component 110 can conclude and/or infer that there exists a quantum state leakage associated with the set of qubits 104.

In some cases, as mentioned above, the detection component 110 can implement a quantum readout apparatus and/or technique that can distinguish between different levels of excited states. Such a quantum readout apparatus and/or technique, as those having ordinary skill in the art will appreciate, can distinguish the ground state from any excited state, can distinguish the first excited state from the second excited state, can distinguish the second excited state from the third excited state, and/or can distinguish the x-th excited state from the y-th excited state for any suitable positive integers x and y where $x \neq y$. In such cases, the detection component 110 can conclude and/or infer that there exists a quantum state leakage associated with the set of qubits 104 when at least one qubit of the set of qubits 104 has a state that is neither the ground state nor the first excited state. Conversely, the detection component 110 can conclude and/or infer that there does not exist a quantum state leakage associated with the set of qubits 104 when every qubit of the set of qubits 104 is in either the ground state or the first excited state (e.g., the set of qubits 104 can be all in the ground state, the set of qubits 104 can be all in the first excited state, and/or some of the set of qubits 104 can be in the ground state while the rest of the set of qubits 104 can be in the first excited state).

In other cases, as mentioned above, the detection component 110 can implement a quantum readout apparatus and/or technique that can binarily distinguish between ground states and excited states. Such a quantum readout apparatus and/or technique, as those having ordinary skill in the art will understand, can distinguish the ground state from any excited state, but cannot distinguish the first excited state from the second excited state, cannot distinguish the second excited state from the third excited state, and/or cannot distinguish the x-th excited state from the y-th excited state for any suitable positive integers x and y where $x \neq y$. In such cases, the detection component 110 can, in various instances, conclude and/or infer that there exists a quantum state leakage associated with the set of qubits 104 when at least one qubit in the set of qubits 104 has a state that is not in the ground state. In various other instances, when the quantum readout apparatus and/or technique implemented by the detection component 110 cannot distinguish between different levels of excited states, one or more reset operations (not shown in FIG. 1) can be executed on the set of qubits 104 prior to the reading, measuring, detecting, and/or otherwise sensing by the detection component 110, and the detection component 110 can conclude and/or infer that there exists a quantum state leakage associated with the set of qubits 104 when at least one qubit of the set of qubits 104 is not in the ground state after the one or more reset operations. Conversely, in various aspects, the detection component 110 can conclude and/or infer that there does not exist a quantum state leakage associated with the set of qubits 104 when every qubit of the set of qubits 104 is in the ground state.

In various embodiments, the strategic pausing system 102 can comprise a pause component 112. In various aspects, the pause component 112 can initiate operations and/or can refrain from initiating operations based on the determinations of the detection component 110. As explained above, the execution component 114 can execute, cause to be executed, and/or otherwise facilitate the execution of a first quantum circuit on the set of qubits 104, and the detection component 110 can read, measure, detect, and/or otherwise sense the resulting states of the set of qubits 104 after execution of the first quantum circuit. In other words, the execution component 114 can perform a quantum computation on the set of qubits 104, and the detection component 110 can read the result. In various aspects, it can be desired for the execution component 114 to execute, cause to be executed, and/or otherwise facilitate the execution of a second quantum circuit on the set of qubits 104. However, if a quantum state leakage occurred during the execution of the first quantum circuit, such quantum state leakage can corrupt and/or contaminate the execution of the second quantum circuit. In various aspects, the pause component 112 can address and/or deal with such quantum state leakage. Specifically, if the detection component 110 concludes and/or infers that there exists a quantum state leakage associated with the set of qubits 104, the pause component 112 can generate a strategic time pause during which such quantum state leakage can decay and/or relax back to a non-leaked state (e.g., a qubit that is in a leaked state can naturally dissipate back to the ground state and/or to the first excited state over time). The pause component 112 can, in various aspects, implement the strategic time pause by transmitting an electronic command to the execution component 114, which instructs the execution component 114 to wait to execute, cause to be executed, and/or otherwise facilitate the execution of the second quantum circuit on the set of qubits 104 until after the strategic time pause elapses. Because the quantum state leakage can decay and/or relax during the strategic time pause, the quantum state leakage is no longer in existence at the time of execution of the second quantum circuit, which means that the execution of the second quantum circuit can be uncorrupted by the quantum state leakage (e.g., a loss of fidelity associated with execution of the second quantum circuit can be avoided due to the strategic time pause). If the detection component 110 concludes and/or infers that there does not exist a quantum state leakage associated with the set of qubits 104, the pause component 112 can refrain from generating the strategic time pause. Accordingly, the execution component 114 can execute, cause to be executed, and/or otherwise facilitate the execution of the second quantum circuit on the set of qubits 104 immediately after the detection component 110 reads, measures, detects, and/or otherwise senses the states of the set of qubits 104 resulting from execution of the first quantum circuit. In this way, the pause component 112 can generate the strategic time pause only when it is needed (e.g., when a quantum state leakage is detected and not when the quantum state leakage is not detected). The result can be that quantum circuits can be executed by the execution component 114 on the set of qubits 104 at a high average repetition rate and without any corresponding drop in fidelity due to quantum state leakage corruption.

In various aspects, the duration of the strategic time pause can be greater than and/or of a same order of magnitude as a coherence time that is associated with the set of qubits 104. For example, if the qubits in the set of qubits 104 have a coherence time of T microseconds for any suitable positive number T, then the duration of the strategic time pause can be greater than and/or equal to T and can be less than and/or equal to 10 T. In some cases, each qubit of the set of qubits 104 can have its own corresponding coherence time (e.g., the qubits can have different coherence times), and the duration of the strategic time pause can be greater than and/or of a same order of magnitude as a maximum coherence time of the set of qubits 104.

In various embodiments, if the detection component 110 can distinguish between different levels of excited states, the pause component 112 can vary, adjust, and/or modulate the duration of the strategic time pause based on the maximum excited state detected by the detection component 110. For example, if the maximum excited state detected by the detection component 110 is a fourth excited state, the pause component 112 can cause the strategic time pause to have a first duration, and if the maximum excited state detected by the detection component 110 is a fifth excited state, the pause component 112 can cause the strategic time pause to have a second duration that is greater than the first duration (e.g., it can take longer for a fifth excited state to dissipate back to ground and/or back to the first excited state than it can for a fourth excited state to dissipate back to ground and/or back to the first excited state). In this way, the pause component 112 can tailor the duration of the strategic time pause to the particular states of the set of qubits 104.

Figure 2:
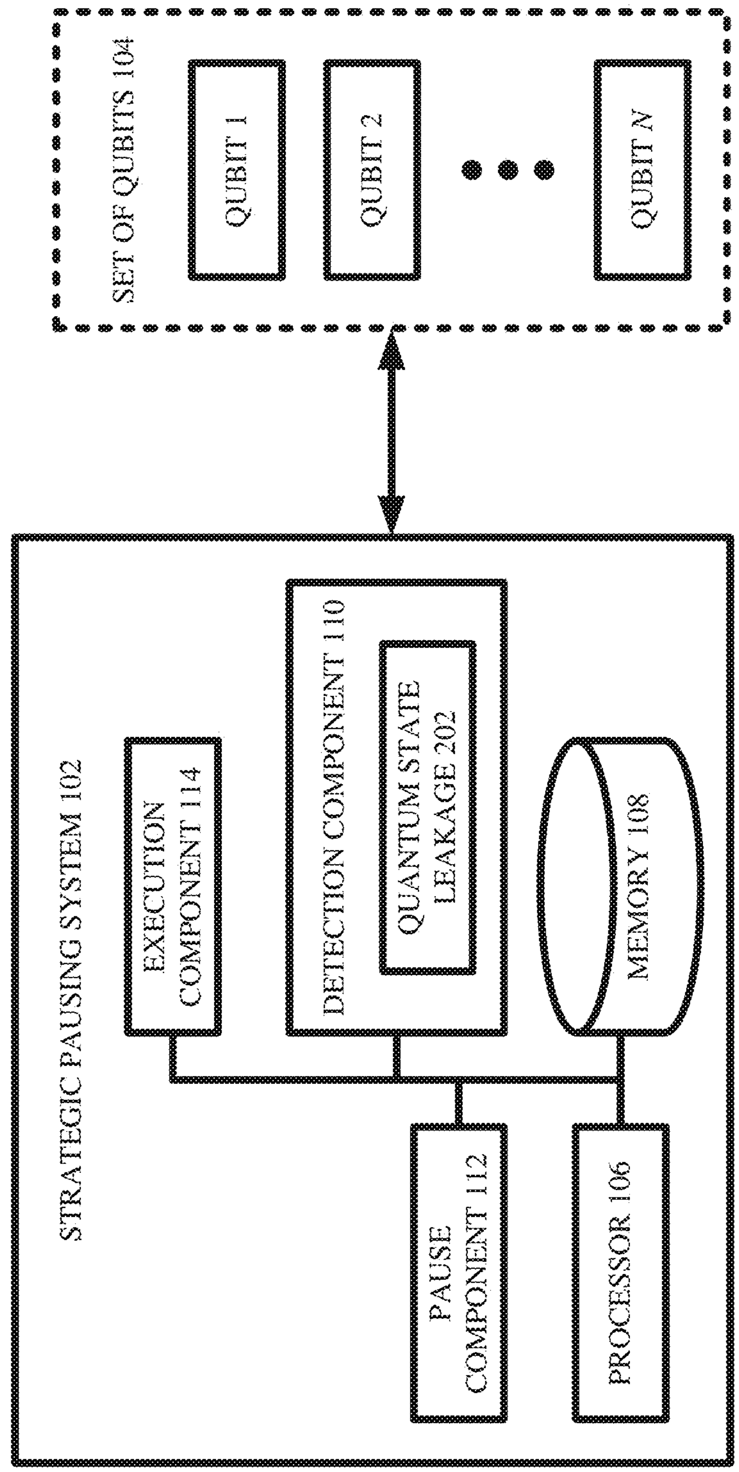
FIG. 2 illustrates a block diagram of an example, non-limiting system including a quantum state leakage that facilitates strategic pausing for quantum state leakage mitigation in accordance with one or more embodiments described herein.

FIG. 2 illustrates a block diagram of an example, non-limiting system 200 including a quantum state leakage that can facilitate strategic pausing for quantum state leakage mitigation in accordance with one or more embodiments described herein. As shown, the system 200 can, in some cases, comprise the same components as the system 100, and can further comprise a quantum state leakage 202.

In various aspects, the detection component 110 can read, measure, detect, and/or otherwise sense via any suitable quantum readout apparatuses/techniques (e.g., microwave readout resonators, photonic sensors) the states of the set of qubits 104. Specifically, since the set of qubits 104 can include n qubits, the detection component 110 can read, measure, detect, and/or otherwise sense n states. In cases where the detection component 110 can distinguish between different levels of excited states, if the detection component 110 determines that any of such n states is a leaked state (e.g., that any of such n states is neither the ground state nor the first excited state), the detection component 110 can conclude and/or infer that the quantum state leakage 202 exists in the set of qubits 104. In cases where the detection component 110 can distinguish between different levels of excited states, if the detection component 110 determines that none of such n states is a leaked state (e.g., that none of such n states is neither the ground state nor the first excited state), the detection component 110 can conclude and/or infer that the quantum state leakage 202 does not exist in the set of qubits 104. In cases where the detection component 110 can only binarily distinguish between ground states and excited states, if the detection component 110 determines that any of such n states is a non-ground state, the detection component 110 can conclude and/or infer that the quantum state leakage 202 exists in the set of qubits 104. In cases where the detection component 110 can only binarily distinguish between ground states and excited states, if the detection component 110 determines that none of such n states is a non-ground state, the detection component 110 can conclude and/or infer that the quantum state leakage 202 does not exist in the set of qubits 104.

Figure 3:
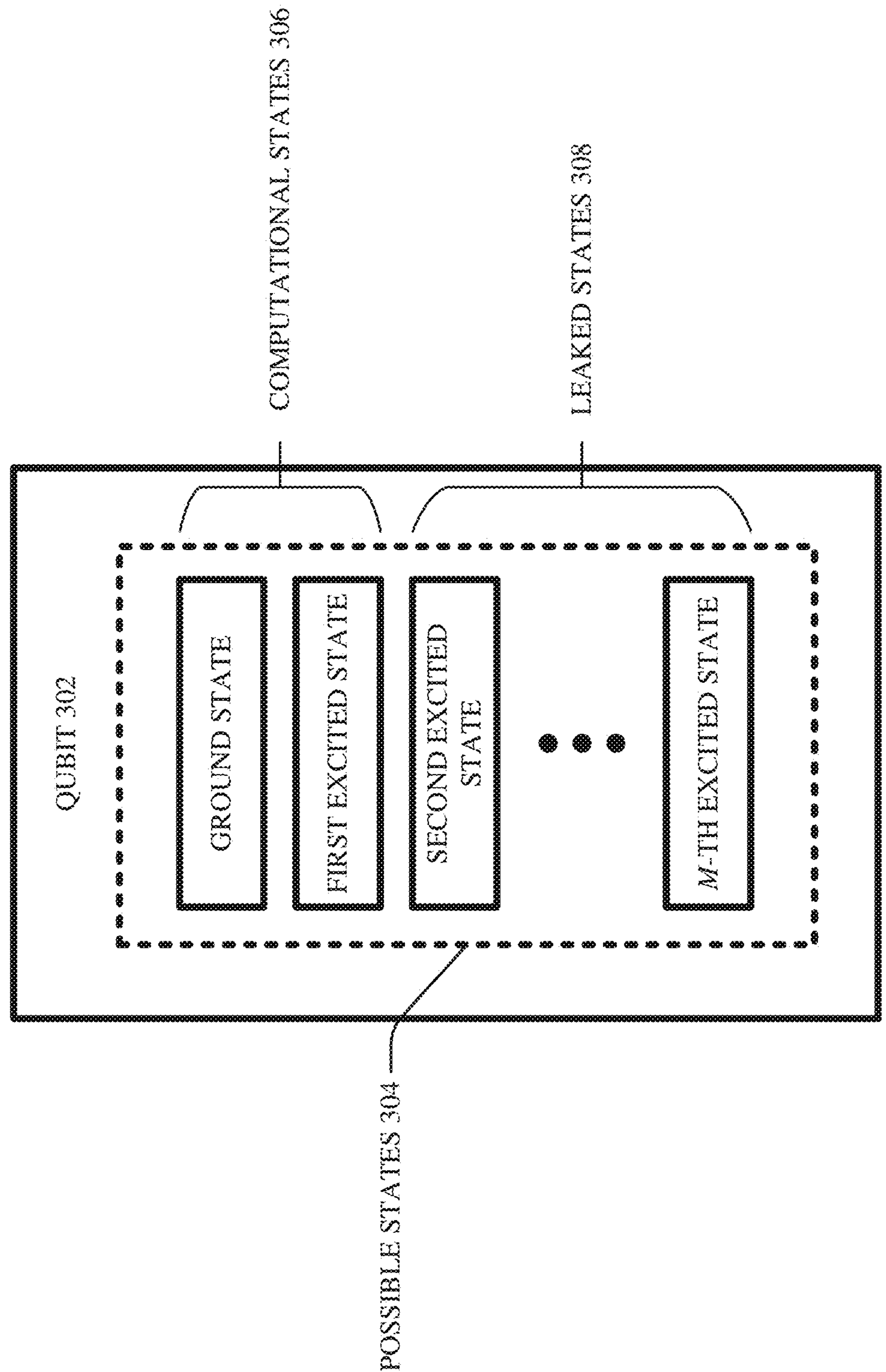
FIG. 3 illustrates a block diagram of an example, non-limiting qubit having various possible quantum states in accordance with one or more embodiments described herein.

FIG. 3 illustrates a block diagram of an example, non-limiting qubit having various possible quantum states in accordance with one or more embodiments described herein. As shown, a qubit 302 can have various possible states 304. Specifically, the qubit 302 can have a ground state, a first excited state, a second excited state, . . . , and an m-th excited state for any suitable positive integer m>1. In various aspects, the ground state and the first excited state can be considered as computational states 306, since those two states are generally and/or frequently used to perform quantum computing and/or quantum information processing (e.g., the ground state can be denoted as $|0\rangle$ and the first excited state can be denoted as $|1\rangle$). In various instances, the higher-order excited states (e.g., the second excited state, the m-th excited state) can be considered as leaked states 308, since those states are generally and/or frequently not used to perform quantum computing and/or quantum information processing. When the qubit 302 is in one of the leaked states 308, execution of a quantum circuit on the qubit 302 can be corrupted and/or contaminated (e.g., inaccurate results can be generated). Accordingly, it can be beneficial to ensure the qubit 302 is in one of the computational states 306 and not in one of the leaked states 308 at the time of execution of a quantum circuit on the qubit 302. As explained herein, the strategic pausing system 102 can ensure that such is the case.

Although FIG. 3 depicts the computational states 306 as including only the ground state and the first excited state, this is a mere non-limiting example. In some cases, the computational states 306 can include the ground state, the first excited state, and any suitable number of higher-order excited states (e.g., the second excited state can, in some cases, be considered a computational state rather than a leaked state). In such cases, the leaked states 308 can include the higher-order excited states that are not included in the computational states 306. Thus, although the herein disclosure mainly discusses embodiments where a leaked state is any state that is neither the ground state nor the first excited state, such discussion is non-limiting.

Figure 4:
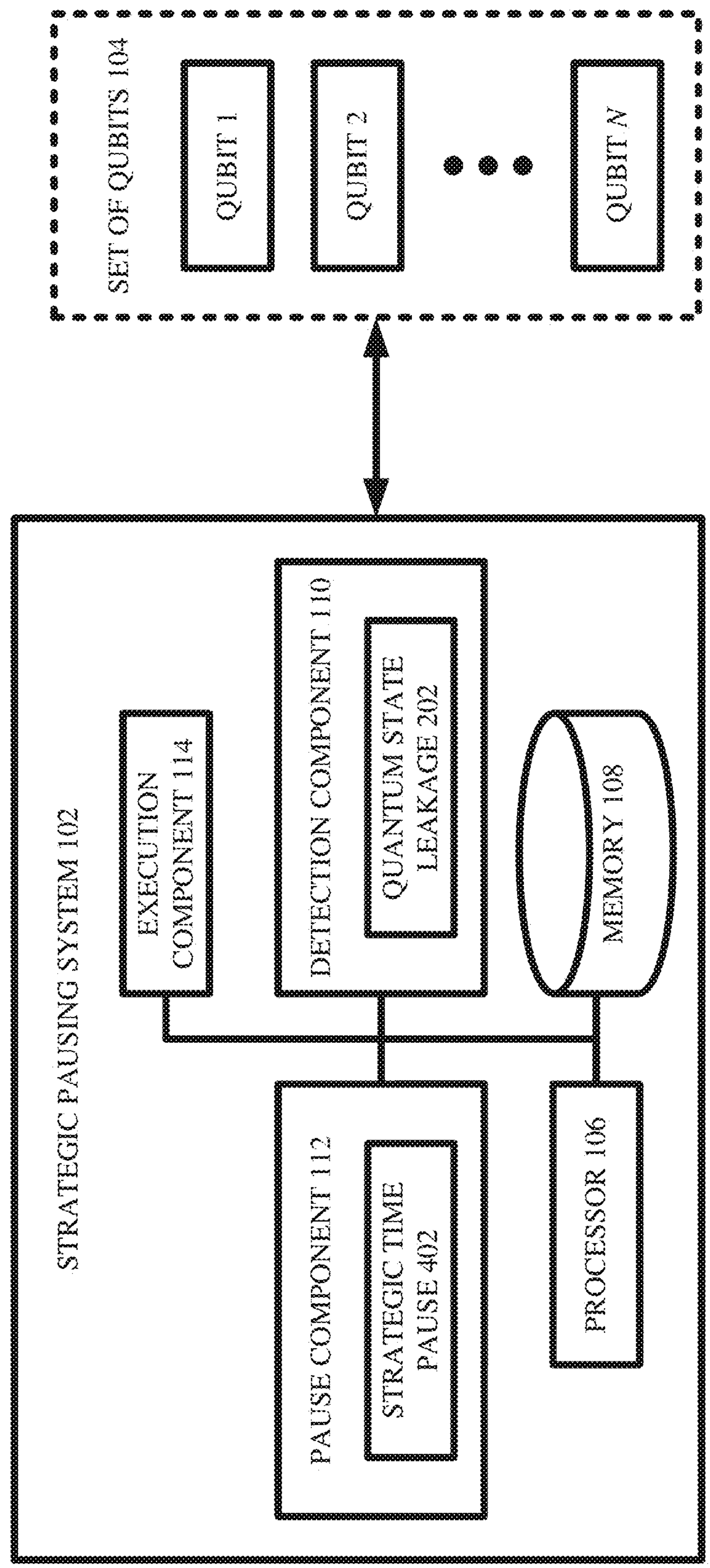
FIG. 4 illustrates a block diagram of an example, non-limiting system including a strategic time pause that facilitates strategic pausing for quantum state leakage mitigation in accordance with one or more embodiments described herein.

FIG. 4 illustrates a block diagram of an example, non-limiting system 400 including a strategic time pause that can facilitate strategic pausing for quantum state leakage mitigation in accordance with one or more embodiments described herein. As shown, the system 400 can, in some cases, comprise the same components as the system 200, and can further comprise a strategic time pause 402.

In various aspects, if the detection component 110 concludes and/or infers that the quantum state leakage 202 exists in the set of qubits 104, the pause component 112 can generate the strategic time pause 402. On the other hand, if the detection component 110 concludes and/or infers that the quantum state leakage 202 does not exist in the set of qubits 104, the pause component 112 can refrain from generating the strategic time pause 402. In various aspects, the strategic time pause 402 can be a span of time during which a quantum circuit is not executed on the set of qubits 104. Accordingly, the quantum state leakage 202 can decay and/or relax during the strategic time pause 402. Once such decay and/or relaxation is complete, the quantum state leakage 202 no longer exists in the set of qubits 104. In other words, any leaked states in the set of qubits 104 can dissipate back to non-leaked states during the strategic time pause 402. Note that such dissipation can occur naturally over time and does not require the set of qubits 104 to be exposed to various calibrated pulses (e.g., which would be separate and/or distinct from pulses used to execute quantum circuits or to measure quantum states) that might otherwise introduce additional noise and/or costs.

Figure 5:
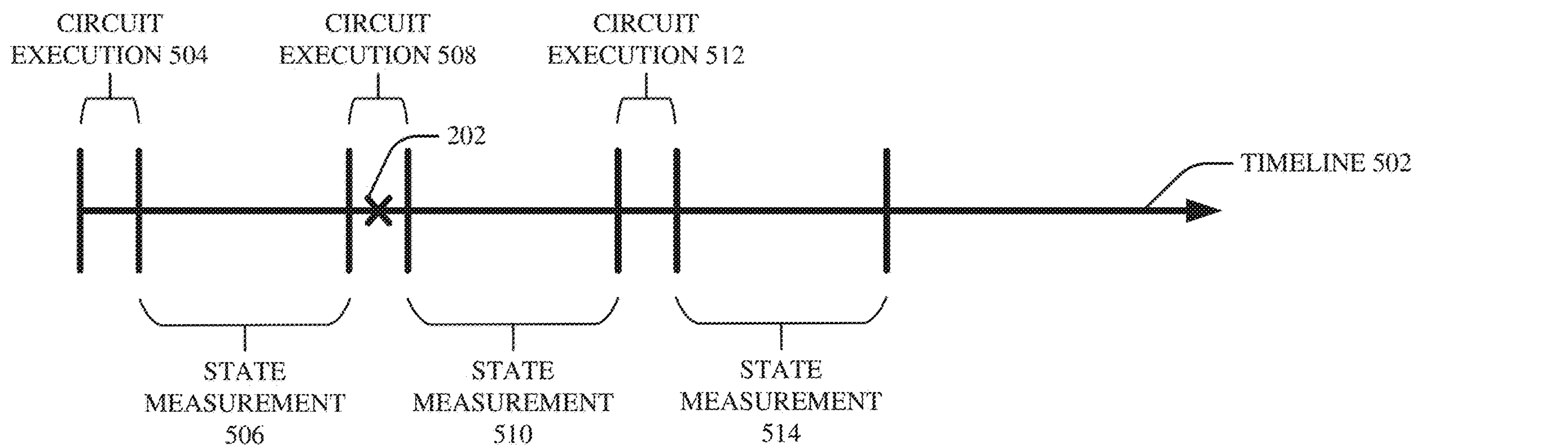
FIG. 5 illustrates block diagrams of example, non-limiting timelines that demonstrate strategic pausing for quantum state leakage mitigation in accordance with one or more embodiments described herein.
Figure 5:
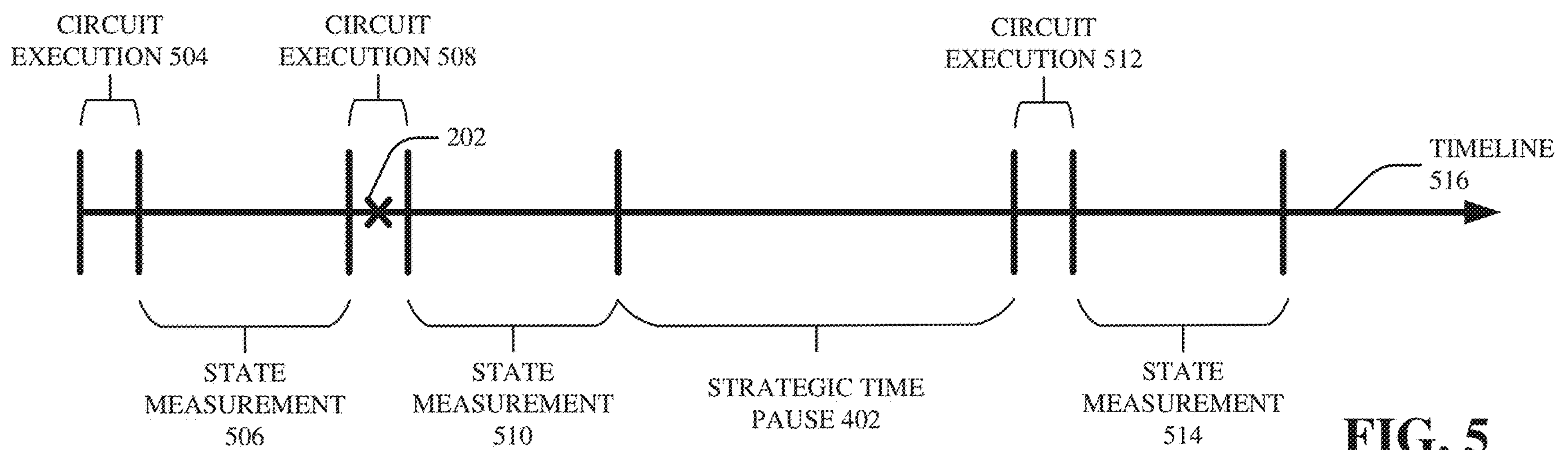

FIG. 5 illustrates block diagrams of example, non-limiting timelines that demonstrate strategic pausing for quantum state leakage mitigation in accordance with one or more embodiments described herein. Specifically, FIG. 5 depicts a timeline 502 and a timeline 516. The timeline 502 can represent quantum computing operations that are performed on the set of qubits 104 over time when the strategic time pause 402 is not implemented. Conversely, the timeline 516 can represent quantum computing operations that are performed on the set of qubits 104 over time when the strategic time pause 402 is implemented. First, consider the timeline 502. As shown, a circuit execution 504 can be performed first on the set of qubits 104 (e.g., a first quantum circuit can be executed on the set of qubits 104), and a state measurement 506 can then be performed on the set of qubits 104 to determine the results of the circuit execution 504. Similarly, a circuit execution 508 can next be performed on the set of qubits 104 (e.g., a second quantum circuit can be executed on the set of qubits 104), and a state measurement 510 can then be performed on the set of qubits 104 to determine the results of the circuit execution 508. Likewise, a circuit execution 512 can then be performed on the set of qubits 104 (e.g., a third quantum circuit can be executed on the set of qubits 104), and a state measurement 514 can then be performed on the set of qubits 104 to determine the results of the circuit execution 512. In other words, the timeline 502 shows that three quantum circuits can be executed on the set of qubits 104, with each quantum circuit being followed by a measurement operation. In various aspects, as shown, the quantum state leakage 202 can arise during the circuit execution 508 (e.g., can arise by chance). In other words, at least one qubit of the set of qubits 104 can enter a leaked state during the circuit execution 508. Unfortunately, the quantum state leakage 202 can persist throughout the state measurement 510 and into the circuit execution 512 (e.g., indeed, the quantum state leakage 202 can, in some cases, persist for several circuit and measurement iterations if left unaddressed). Thus, the quantum state leakage 202 can negatively affect the circuit execution 512 (e.g., and/or other subsequent circuit executions), which can result in a loss of fidelity.

In various aspects, this loss of fidelity can be avoided by implementing the strategic time pause 402. Consider the timeline 516. Just as with the timeline 502, in the timeline 516, the circuit execution 504 can be performed first, followed by the state measurement 506, followed by the circuit execution 508, followed by the state measurement 510. However, instead of performing the circuit execution 512 immediately after the state measurement 510, the strategic time pause 402 can be inserted between the state measurement 510 and the circuit execution 512, in response to the state measurement 510 detecting the quantum state leakage 202. Accordingly, the quantum state leakage 202 can decay and/or relax back to a non-leaked state during the strategic time pause 402. Once the strategic time pause 402 elapses, the circuit execution 512 can be performed, followed by the state measurement 514. Because the quantum state leakage 202 can decay and/or relax during the strategic time pause 402, the quantum state leakage 202 is no longer present at the time of the circuit execution 512, which means that the circuit execution 512 can be uncorrupted and/or uncontaminated by the quantum state leakage 202.

Notice that there is no pause inserted between the state measurement 506 and the circuit execution 508. This can be due to the fact that there is no quantum state leakage 202 that arises during the circuit execution 504. In other words, the strategic time pause 402 can be inserted and/or implemented when it is needed (e.g., when a leaked state is detected) and can be not inserted and/or not implemented when it is not needed (e.g., when a leaked state is not detected). The result can be an increased average repetition rate without the corresponding loss of fidelity due to leakages.

Those having ordinary skill in the art will appreciate that FIG. 5 is illustrative, non-limiting, and not necessarily drawing to scale.

Figure 6:
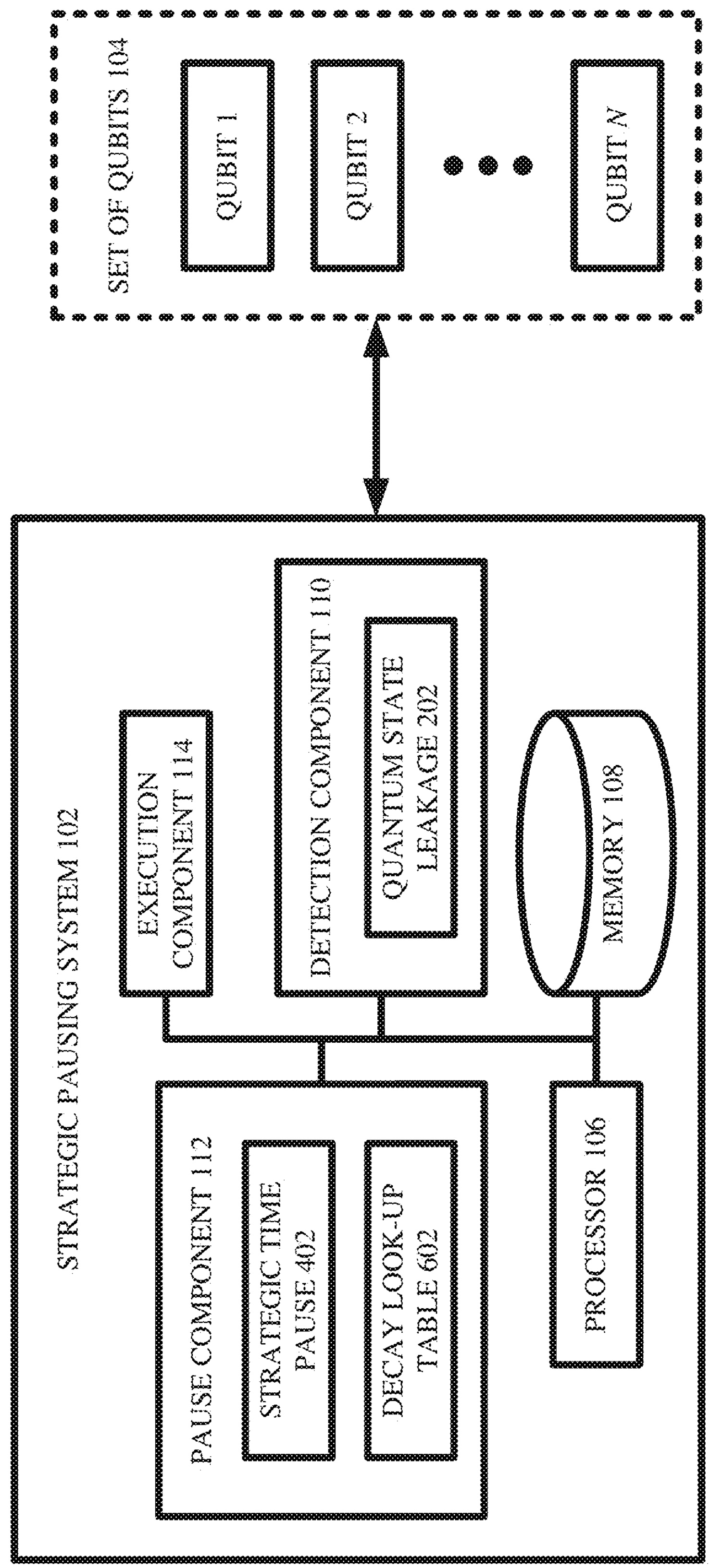
FIG. 6 illustrates a block diagram of an example, non-limiting system including a decay look-up table that facilitates strategic pausing for quantum state leakage mitigation in accordance with one or more embodiments described herein.

FIG. 6 illustrates a block diagram of an example, non-limiting system 600 including a decay look-up table that can facilitate strategic pausing for quantum state leakage mitigation in accordance with one or more embodiments described herein. As shown, the system 600 can, in some cases, comprise the same components as the system 400, and can further comprise a decay look-up table 602.

In various embodiments, if the detection component 110 can distinguish between different levels of excited states, the pause component 112 can alter the duration of the strategic time pause 402 based on the maximum excited state detected by the detection component 110. In various cases, to facilitate such alteration of the duration of the strategic time pause 402, the pause component 112 can have any suitable form of electronic access to a decay look-up table 602. In various aspects, the decay look-up table 602 can be any suitable data structure (e.g., relational data structure, graph data structure, hybrid data structure) that can be centralized and/or distributed and that can map and/or correlate different levels of excited states of qubits to corresponding decay times. In other words, the decay look-up table 602 can indicate how much time is needed for a particular leaked state to naturally relax back to a non-leaked state (e.g., to relax back to the ground state and/or to the first excited state). For instance, the decay look-up table 602 can indicate that the second excited state of a qubit in the set of qubits 104 can relax back to the first excited state in q microseconds for any suitable positive integer q, can indicate that the third excited state of a qubit in the set of qubits 104 can relax back to the first excited state in r microseconds for any suitable positive integer r where $r>q$, and/or can indicate that the fourth excited state of a qubit in the set of qubits 104 can relax back to the first excited state in s microseconds for any suitable positive integer s where $s>r$. Thus, if the detection component 110 determines that at least one qubit in the set of qubits 104 is in the fourth excited state and that no qubit in the set of qubits 104 is in an excited state above the fourth excited state, the pause component 112 can cause the strategic time pause 402 to have a duration of s microseconds. If the detection component 110 determines that at least one qubit in the set of qubits 104 is in the third excited state and that no qubit in the set of qubits 104 is in an excited state above the third excited state, the pause component 112 can cause the strategic time pause 402 to have a duration of r microseconds. If the detection component 110 determines that at least one qubit in the set of qubits 104 is in the second excited state and that no qubit in the set of qubits 104 is in an excited state above the second excited state, the pause component 112 can cause the strategic time pause 402 to have a duration of q microseconds. In this way, the pause component 112 can customize and/or tailor the duration of the strategic time pause 402 based on the magnitude of the quantum state leakage 202.

In various aspects, the decay look-up table 602 can be obtained and/or generated in any suitable fashion (e.g., can be obtained via routine experimentation in a laboratory setting in which a controlled qubit is forced into a leaked state and in which the time it takes for the controlled qubit to naturally decay back to the first-excited state and/or back to the ground state is recorded).

Figure 7:
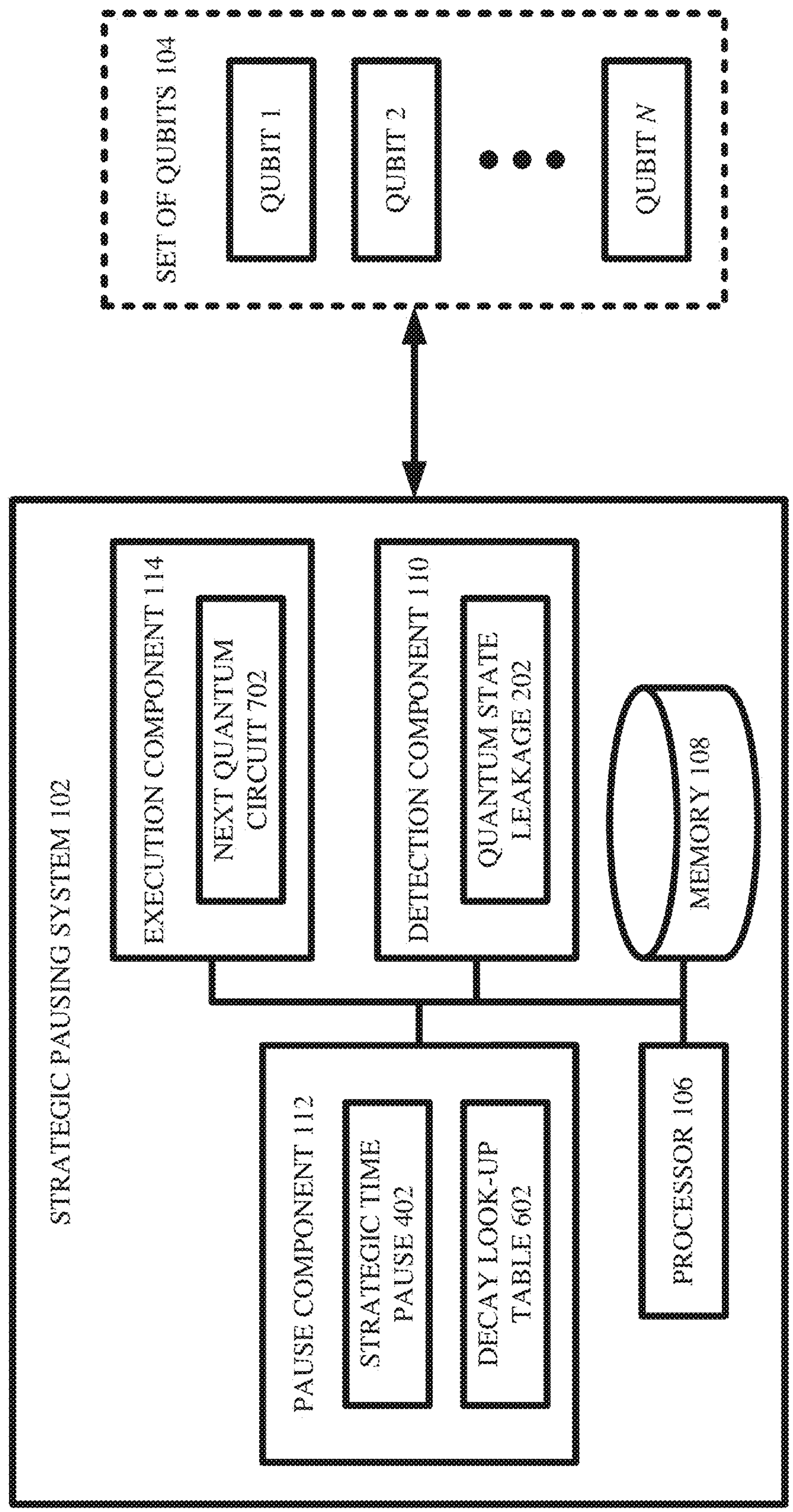
FIG. 7 illustrates a block diagram of an example, non-limiting system including a next quantum circuit that facilitates strategic pausing for quantum state leakage mitigation in accordance with one or more embodiments described herein.

FIG. 7 illustrates a block diagram of an example, non-limiting system 700 including a next quantum circuit that can facilitate strategic pausing for quantum state leakage mitigation in accordance with one or more embodiments described herein. As shown, the system 700 can, in some cases, comprise the same components as the system 600, and can further comprise a next quantum circuit 702.

In various embodiments, the execution component 114 can execute, cause to be executed, and/or otherwise facilitate the execution of the next quantum circuit 702 on the set of qubits 104, after the strategic time pause 402 elapses. In other words, the pause component 112 can instruct and/or command the execution component 114 to stall the execution of the next quantum circuit 702 until after the strategic time pause 402 elapses. As mentioned above, the quantum state leakage 202 can decay and/or relax during the strategic time pause 402. Thus, at the time of execution of the next quantum circuit 702, the quantum state leakage 202 can no longer exist, which means that the fidelity and/or accuracy associated with the execution of the next quantum circuit 702 can be undiminished by the quantum state leakage 202. In various aspects, if the strategic time pause 402 is not generated by the pause component 112, the execution component 114 can execute, cause to be executed, and/or otherwise facilitate the execution of the next quantum circuit 702 on the set of qubits 104 immediately after the detection component 110 reads, measures, detects, and/or otherwise senses the states of the set of qubits 104. That is, the pause component 112 can instruct and/or command the execution component 114 that it need not stall the execution of the next quantum circuit 702. Again, this can result in an increased average repetition rate without a corresponding drop in fidelity.

Figure 8:
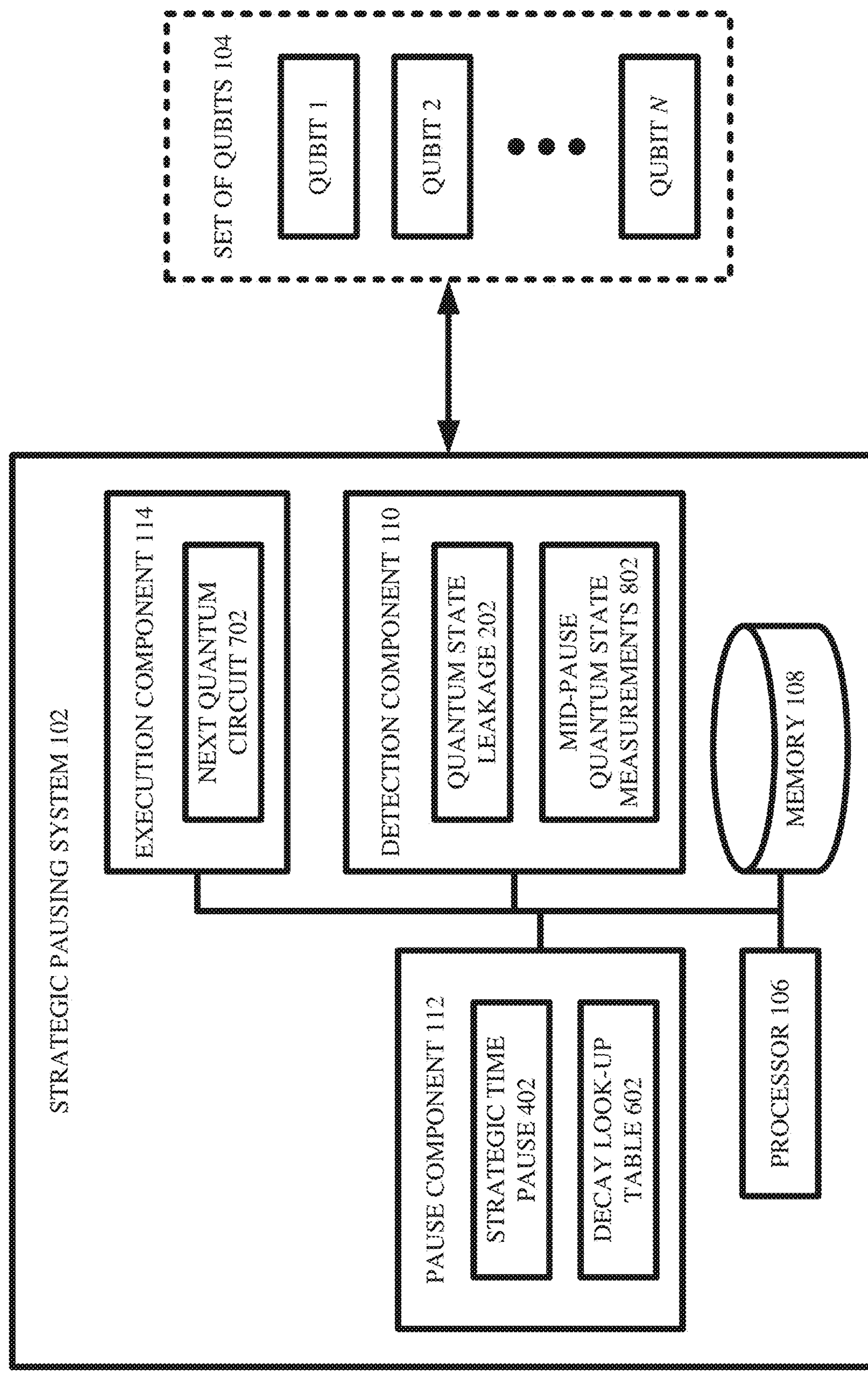
FIG. 8 illustrates a block diagram of an example, non-limiting system including mid-pause quantum state measurements that facilitates strategic pausing for quantum state leakage mitigation in accordance with one or more embodiments described herein.

FIG. 8 illustrates a block diagram of an example, non-limiting system 800 including mid-pause quantum state measurements that can facilitate strategic pausing for quantum state leakage mitigation in accordance with one or more embodiments described herein. As shown, the system 800 can, in some cases, comprise the same components as the system 700, and can further comprise mid-pause quantum state measurements 802.

In various aspects, the detection component 110 can perform one or more mid-pause quantum state measurements 802. That is, the detection component 110 can, in some cases, read, measure, detect, and/or otherwise sense the states of the set of qubits 104 during the strategic time pause 402 (e.g., before the strategic time pause 402 elapses). In various instances, if the mid-pause quantum state measurements 802 indicate that the quantum state leakage 202 has already dissipated before the strategic time pause 402 has elapsed, the execution component 114 can cease stalling the execution of the next quantum circuit 702 (e.g., the next quantum circuit 702 can be executed on the set of qubits 104 before the end of the strategic time pause 402 if the quantum state leakage 202 has already decayed, such as in a situation where the duration of the strategic time pause 402 is longer than needed). On the other hand, if the mid-pause quantum state measurements 802 indicate that the quantum state leakage 202 has not yet dissipated, the execution component 114 can continue to stall the execution of the next quantum circuit 702 (e.g., the next quantum circuit 702 should not yet be executed on the set of qubits 104 since the quantum state leakage 202 has not yet decayed). In various instances, any suitable number of mid-pause quantum state measurements 802 can be implemented during the strategic time pause 402. In various cases where multiple mid-pause quantum state measurements 802 are implemented, they can be performed at any suitable regular and/or irregular intervals (e.g., at intervals that are separated by the coherence time of the set of qubits 104).

Figure 9:
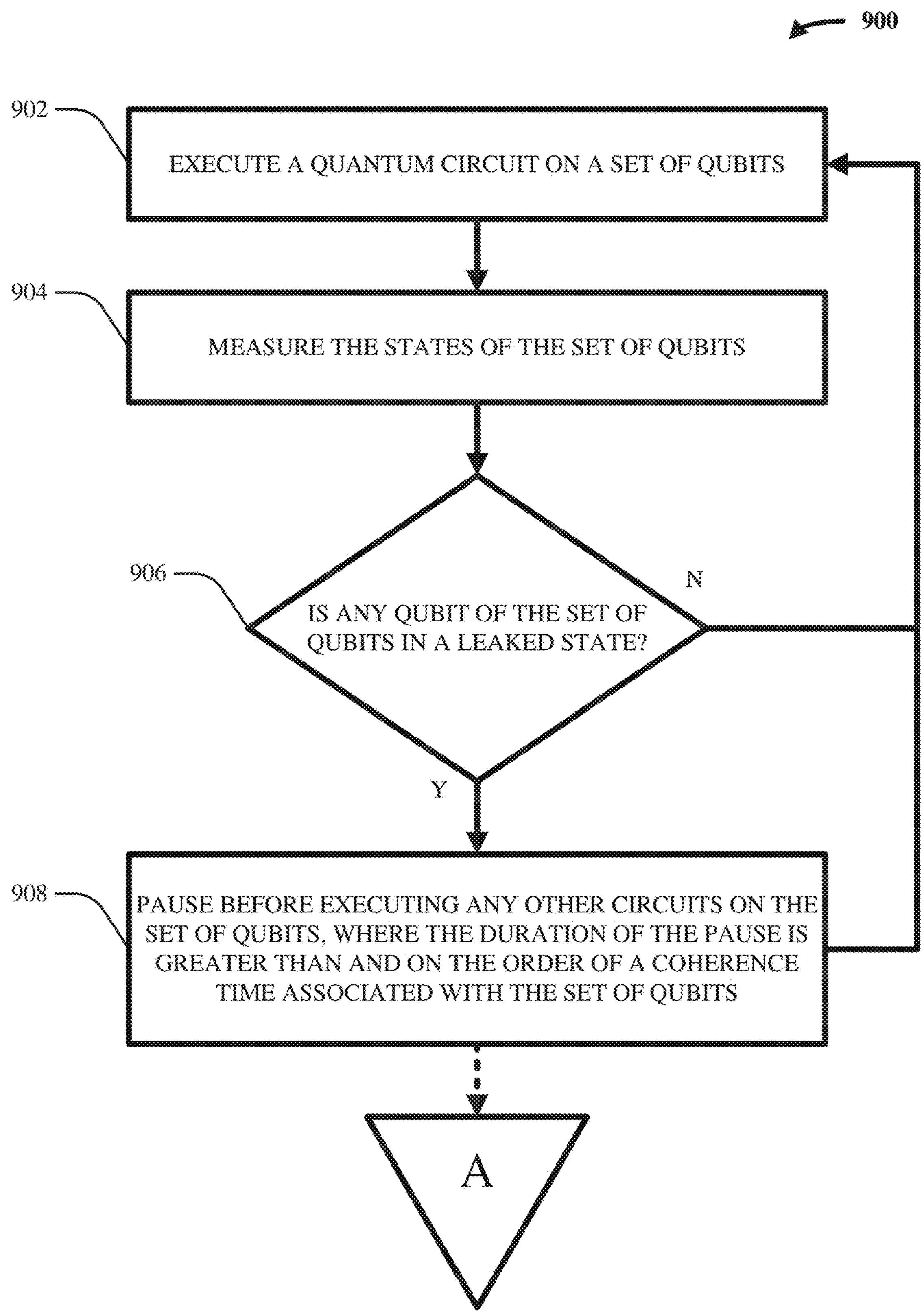
FIGS. 9-11 illustrate flow diagrams of example, non-limiting computer-implemented methods that facilitate strategic pausing for quantum state leakage mitigation in accordance with one or more embodiments described herein.
Figure 10:
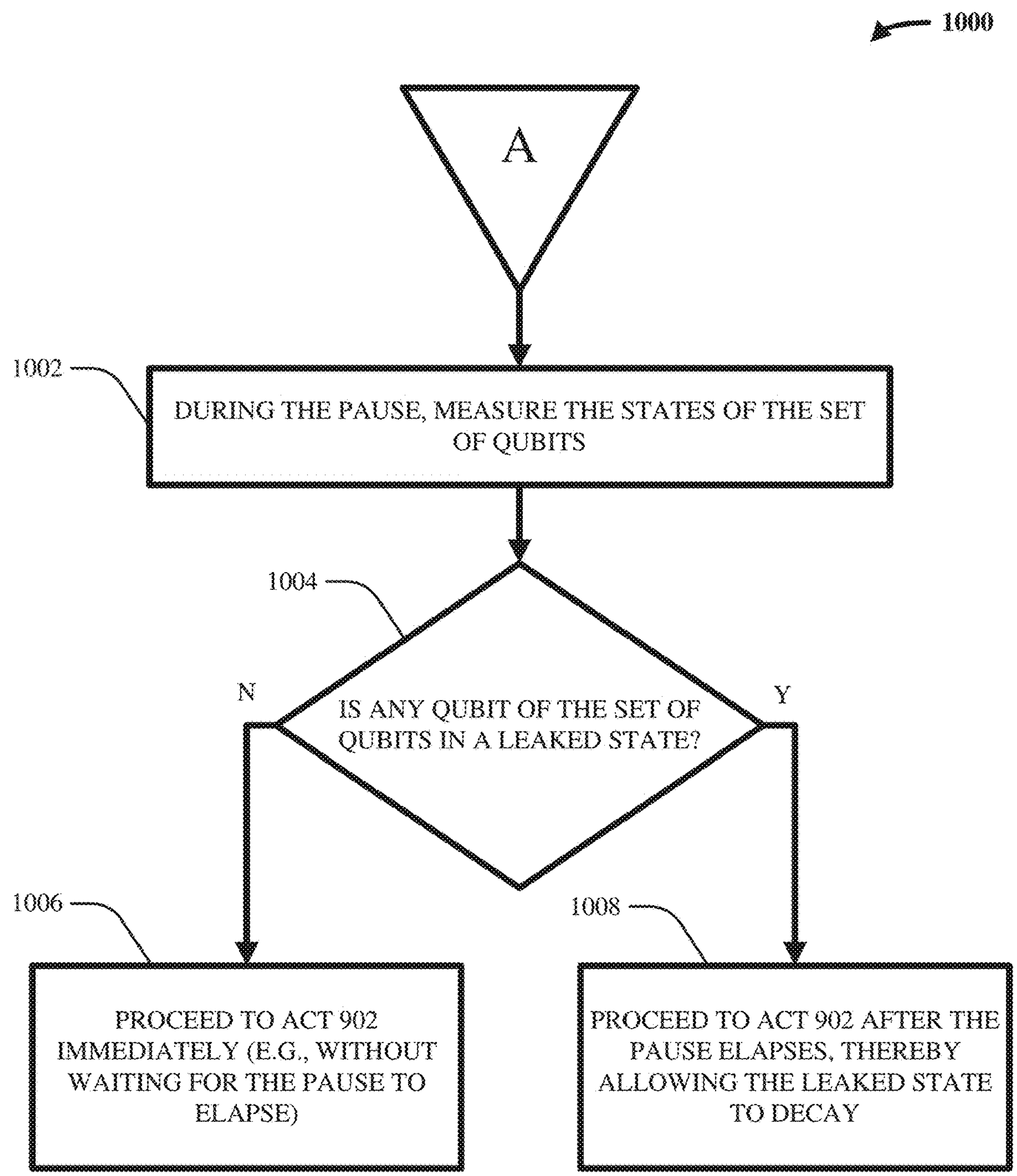
Figure 11:
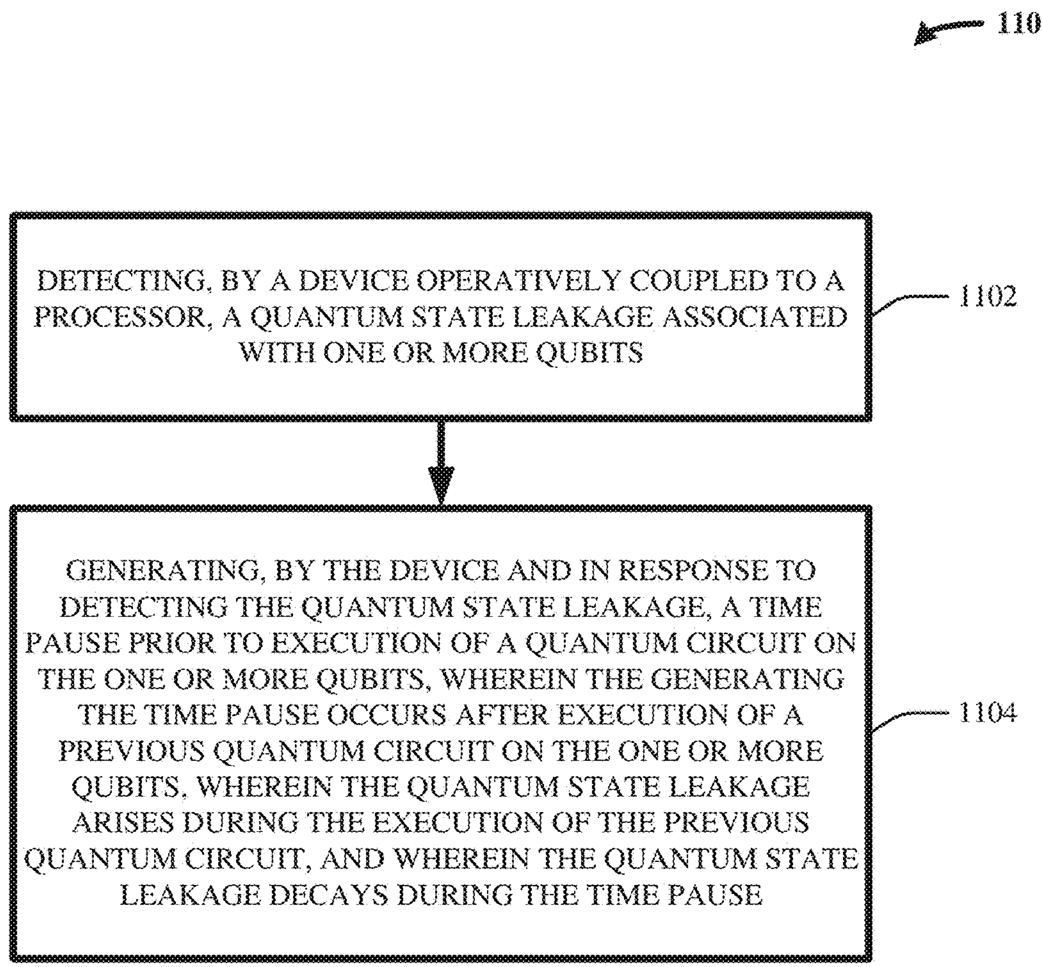

FIGS. 9-11 illustrate flow diagrams of example, non-limiting computer-implemented methods 900, 1000, and 1100 that can facilitate strategic pausing for quantum state leakage mitigation in accordance with one or more embodiments described herein.

Consider FIG. 9 and the computer-implemented method 900. As shown, in various embodiments, act 902 can include executing, by a device (e.g., 114) operatively coupled to a processor, a quantum circuit (e.g., 508) on a set of qubits (e.g., 104).

In various aspects, act 904 can include measuring, by the device (e.g., 110), the states of the set of qubits.

In various instances, act 906 can include determining, by the device (e.g., 110), whether any qubit of the set of qubits is in a leaked state (e.g., 202 and/or 308). If not, the computer-implemented method 900 can proceed back to act 902. If so, the computer-implemented method 900 can proceed to act 908.

In various cases, act 908 can include pausing, by the device (e.g., 112), before executing any other circuits (e.g., 512 and/or 702) on the set of qubits, where the duration of the pause (e.g., 402) is greater than and on the order of a coherence time associated with the set of qubits. In various aspects, the computer-implemented method 900 can then proceed back to act 902.

To summarize, the computer-implemented method 900 can include executing a quantum circuit on a set of qubits, measuring quantum states of the set of qubits, determining whether there is a leaked quantum state, and, if so, stalling the execution of the next quantum circuit until after any leaked quantum states decay. If there is not a leaked quantum state, the next quantum circuit can be executed immediately, without waiting/stalling.

In some aspects, as shown, the computer-implemented method 900 can sometimes proceed from act 908 to callout A, which is illustrated in FIG. 10.

Consider the FIG. 10 and the computer-implemented method 1000. As shown, in various aspects, the callout A can proceed to act 1002, which can include measuring, by the device (e.g., 110) and during the pause, the states of the set of qubits (e.g., 802).

In various instances, act 1004 can include determining, by the device (e.g., 110), whether any qubit of the set of qubits is in a leaked state. If not, the computer-implemented method 1000 can proceed to act 1006. If so, the computer-implemented method 1000 can proceed to act 1008.

In various cases, act 1006 can include proceeding back to act 902 immediately; that is, without waiting for the pause to elapse.

In various aspects, act 1008 can include proceeding back to act 902 after the pause elapses, thereby allowing any detected leaked states to decay.

In summary, the computer-implemented method 1000 shows how the mid-pause quantum state measurements 802 can be implemented (e.g., the execution component 114 need not stall for the entire duration of the strategic time pause 402 if the quantum state leakage 202 has already decayed before the end of the strategic time pause 402).

Consider FIG. 11 and the computer-implemented method 1100. In various embodiments, act 1102 can include detecting, by a device (e.g., 110) operatively coupled to a processor, a quantum state leakage (e.g., 202) associated with one or more qubits (e.g., 104).

In various aspects, act 1104 can include generating, by the device (e.g., 112) and in response to the detecting the quantum state leakage, a time pause (e.g., 402) prior to execution of a quantum circuit (e.g., 702 and/or 512) on the one or more qubits. In some cases, the generating the time pause can occur after execution of a previous quantum circuit (e.g., 508) on the one or more qubits. In some cases, the quantum state leakage can arise during the execution of the previous quantum circuit. In some cases, the quantum state leakage can decay during the time pause.

Although not shown in FIG. 11, in some cases, the computer-implemented method 1100 can further comprise: performing, by the device (e.g., 110), one or more quantum state measurements on the one or more qubits during the time pause (e.g., 802), wherein the one or more quantum state measurements binarily distinguish between ground states and excited states; and executing, by the device (e.g., 114), the quantum circuit on the one or more qubits if the one or more quantum state measurements indicate that the one or more qubits are in ground states.

Although not shown in FIG. 11, in some cases, the computer-implemented method 1100 can further comprise: performing, by the device (e.g., 110), one or more quantum state measurements on the one or more qubits during the time pause (e.g., 802), wherein the one or more quantum state measurements distinguish between different levels of excited states; and executing, by the device (e.g., 114), the quantum circuit on the one or more qubits if the one or more quantum state measurements indicate that the one or more qubits are in ground states first excited states, or a combination of ground states and first excited states.

Although not shown in FIG. 11, in some cases, the computer-implemented method 1100 can further comprise varying, by the device (e.g., 112), a duration of the time pause based on a maximum excited state detected during the detecting.

Although the herein disclosure discusses embodiments where the execution component 114 executes and/or cause to be executed quantum circuits on the set of qubits 104 and where the detection component 110 measures the states of the set of qubits 104, this is illustrative and non-limiting. In some embodiments, the execution component 114 can execute and/or cause to be executed quantum circuits that operate on only a subset of the set of qubits 104. In such cases, the detection component 110 can measure the states of such subset of the set of qubits 104, rather than measuring the states of the entire set of qubits 104.

Various embodiments of the invention can address the problem of quantum state leakage. Specifically, when a qubit is in a leaked state, it can corrupt and/or contaminate the execution of a subsequent quantum circuit that involves the qubit. In various aspects, embodiments of the invention can solve this problem by inserting a time pause prior to the execution of a quantum circuit whenever a quantum state leakage is detected. The time pause can allow the quantum state leakage to naturally relax back to a non-leaked state, at which point the subsequent quantum circuit can be executed without loss of fidelity. Moreover, an average repetition rate of such quantum circuits can be increased by various embodiments of the invention since such a time pause can be not inserted when no quantum state leakage is detected. Thus, embodiments of the invention can quicken the repetition rate of quantum circuit execution without experiencing a corresponding drop in fidelity that normally accompanies quantum state leakages. Furthermore, various embodiments of the invention can facilitate such benefits without implementing specially tuned leakage-mitigation pulses that would otherwise add noise and cost to quantum computing.

Figure 12:
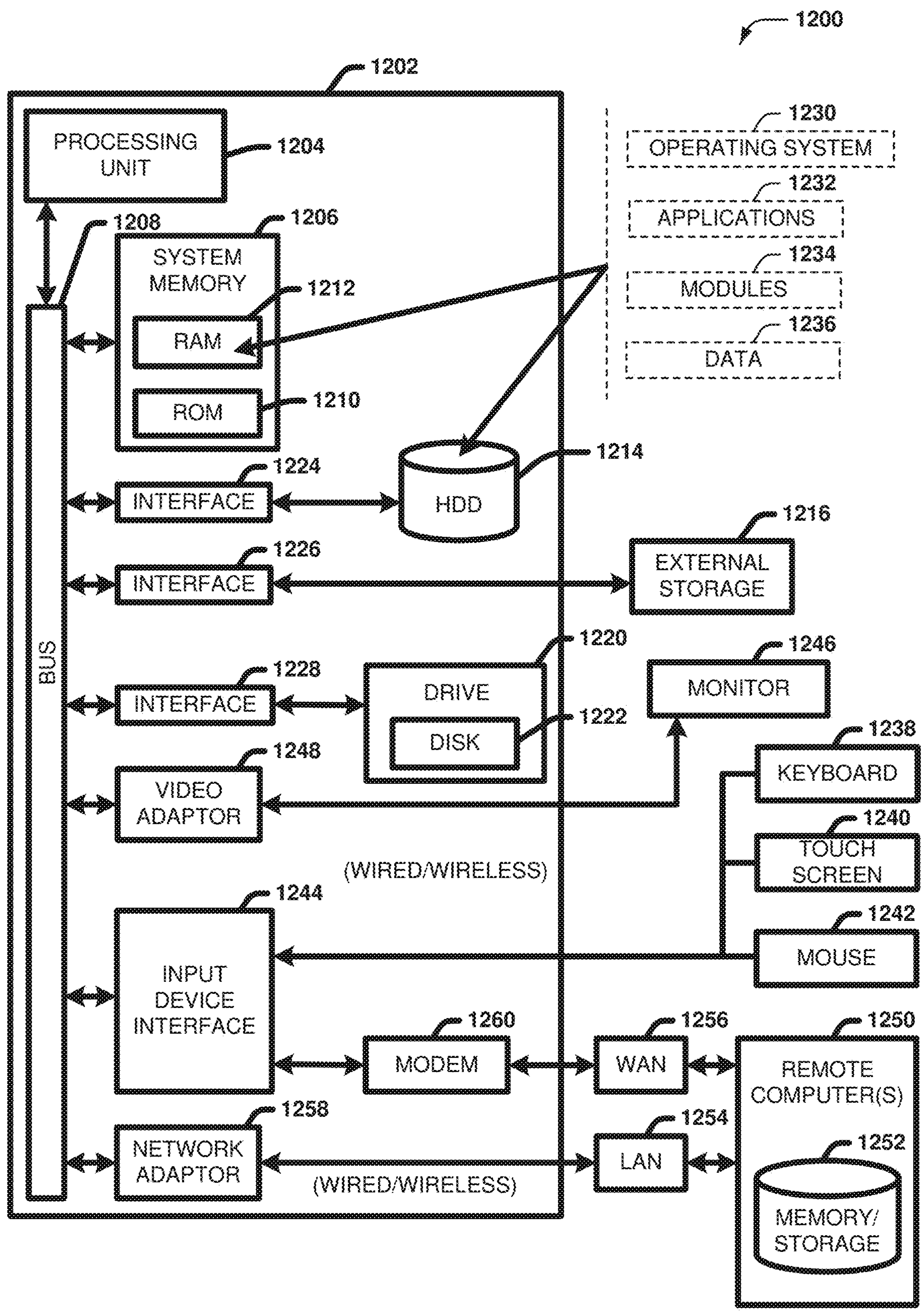
FIG. 12 illustrates a block diagram of an example, non-limiting operating environment in which one or more embodiments described herein can be facilitated.

In order to provide additional context for various embodiments described herein, FIG. 12 and the following discussion are intended to provide a brief, general description of a suitable computing environment 1200 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 12, the example environment 1200 for implementing various embodiments of the aspects described herein includes a computer 1202, the computer 1202 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes ROM 1210 and RAM 1212. A basic input/output system (BIOS) can be stored in a non-volatile memory such as ROM, erasable programmable read only memory (EPROM), EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive (HDD) 1214 (e.g., EIDE, SATA), one or more external storage devices 1216 (e.g., a magnetic floppy disk drive (FDD) 1216, a memory stick or flash drive reader, a memory card reader, etc.) and a drive 1220, e.g., such as a solid state drive, an optical disk drive, which can read or write from a disk 1222, such as a CD-ROM disc, a DVD, a BD, etc. Alternatively, where a solid state drive is involved, disk 1222 would not be included, unless separate. While the internal HDD 1214 is illustrated as located within the computer 1202, the internal HDD 1214 can also be configured for external use in a suitable chassis (not shown). Additionally, while not shown in environment 1200, a solid state drive (SSD) could be used in addition to, or in place of, an HDD 1214. The HDD 1214, external storage device(s) 1216 and drive 1220 can be connected to the system bus 1208 by an HDD interface 1224, an external storage interface 1226 and a drive interface 1228, respectively. The interface 1224 for external drive implementations can include at least one or both of Universal Serial Bus (USB) and Institute of Electrical and Electronics Engineers (IEEE)

1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. The systems and methods described herein can be implemented utilizing various commercially available operating systems or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12. In such an embodiment, operating system 1230 can comprise one virtual machine (VM) of multiple VMs hosted at computer 1202. Furthermore, operating system 1230 can provide runtime environments, such as the Java runtime environment or the .NET framework, for applications 1232. Runtime environments are consistent execution environments that allow applications 1232 to run on any operating system that includes the runtime environment. Similarly, operating system 1230 can support containers, and applications 1232 can be in the form of containers, which are lightweight, standalone, executable packages of software that include, e.g., code, runtime, system tools, system libraries and settings for an application.

Further, computer 1202 can be enable with a security module, such as a trusted processing module (TPM). For instance with a TPM, boot components hash next in time boot components, and wait for a match of results to secured values, before loading a next boot component. This process can take place at any layer in the code execution stack of computer 1202, e.g., applied at the application execution level or at the operating system (OS) kernel level, thereby enabling security at any level of code execution.

A user can enter commands and information into the computer 1202 through one or more wired/wireless input devices, e.g., a keyboard 1238, a touch screen 1240, and a pointing device, such as a mouse 1242. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1204 through an input device interface 1244 that can be coupled to the system bus 1208, but can be connected by other interfaces, such as a parallel port, an IEEE 1394 serial port, a game port, a USB port, an IR interface, a BLUETOOTH® interface, etc.

A monitor 1246 or other type of display device can be also connected to the system bus 1208 via an interface, such as a video adapter 1248. In addition to the monitor 1246, a computer typically includes other peripheral output devices (not shown), such as speakers, printers, etc.

The computer 1202 can operate in a networked environment using logical connections via wired and/or wireless communications to one or more remote computers, such as a remote computer(s) 1250. The remote computer(s) 1250 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1252 is illustrated. The logical connections depicted include wired/wireless connectivity to a local area network (LAN) 1254 and/or larger networks, e.g., a wide area network (WAN) 1256. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 can be connected to the local network 1254 through a wired and/or wireless communication network interface or adapter 1258. The adapter 1258 can facilitate wired or wireless communication to the LAN 1254, which can also include a wireless access point (AP) disposed thereon for communicating with the adapter 1258 in a wireless mode.

When used in a WAN networking environment, the computer 1202 can include a modem 1260 or can be connected to a communications server on the WAN 1256 via other means for establishing communications over the WAN 1256, such as by way of the Internet. The modem 1260, which can be internal or external and a wired or wireless device, can be connected to the system bus 1208 via the input device interface 1244. In a networked environment, program modules depicted relative to the computer 1202 or portions thereof, can be stored in the remote memory/storage device 1252. It will be appreciated that the network connections shown are example and other means of establishing a communications link between the computers can be used.

When used in either a LAN or WAN networking environment, the computer 1202 can access cloud storage systems or other network-based storage systems in addition to, or in place of, external storage devices 1216 as described above, such as but not limited to a network virtual machine providing one or more aspects of storage or processing of information. Generally, a connection between the computer 1202 and a cloud storage system can be established over a LAN 1254 or WAN 1256 e.g., by the adapter 1258 or modem 1260, respectively. Upon connecting the computer 1202 to an associated cloud storage system, the external storage interface 1226 can, with the aid of the adapter 1258 and/or modem 1260, manage storage provided by the cloud storage system as it would other types of external storage. For instance, the external storage interface 1226 can be configured to provide access to cloud storage sources as if those sources were physically connected to the computer 1202.

The computer 1202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or an ad hoc communication between at least two devices.

Figure 13:
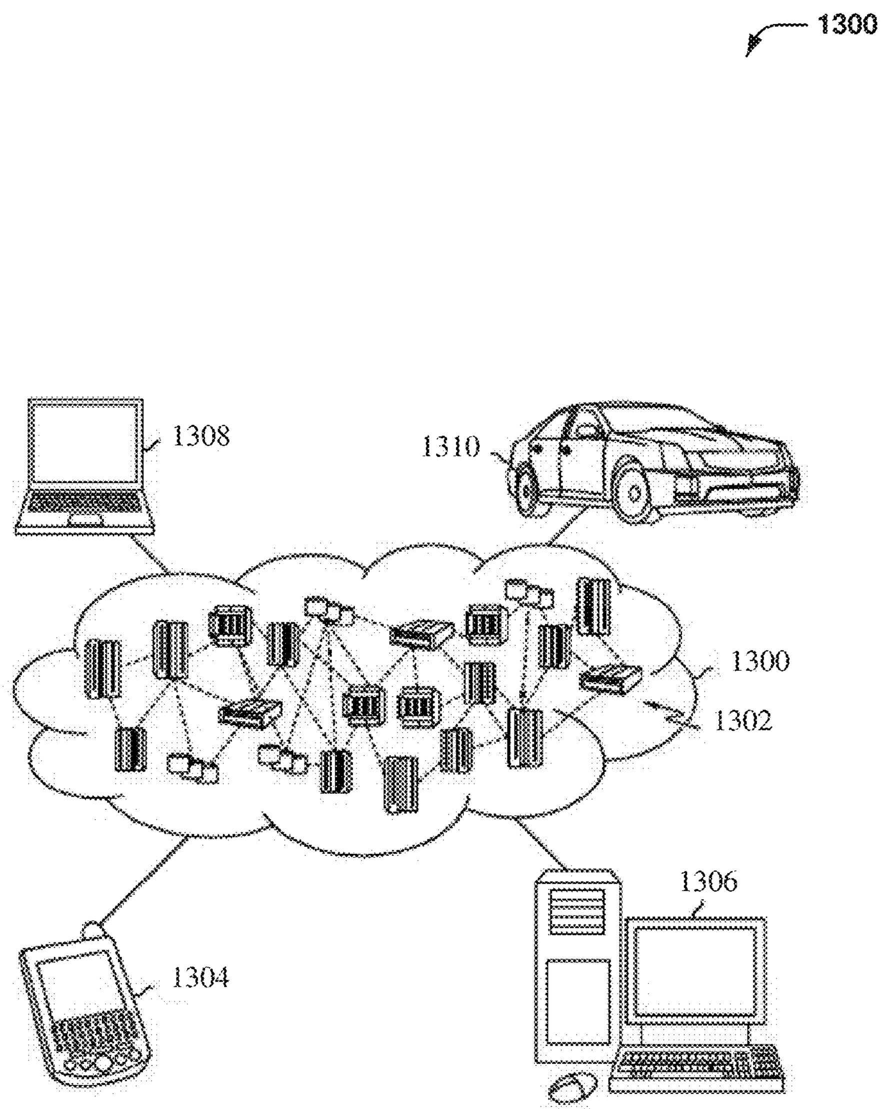
FIG. 13 illustrates an example, non-limiting cloud computing environment in accordance with one or more embodiments described herein.

Referring now to FIG. 13, illustrative cloud computing environment 1300 is depicted. As shown, cloud computing environment 1300 includes one or more cloud computing nodes 1302 with which local computing devices used by cloud consumers, such as, for example, personal digital assistant (PDA) or cellular telephone 1304, desktop computer 1306, laptop computer 1308, and/or automobile computer system 1310 may communicate. Nodes 1302 may communicate with one another. They may be grouped (not shown) physically or virtually, in one or more networks, such as Private, Community, Public, or Hybrid clouds as described hereinabove, or a combination thereof. This allows cloud computing environment 1300 to offer infrastructure, platforms and/or software as services for which a cloud consumer does not need to maintain resources on a local computing device. It is understood that the types of computing devices 1304-1310 shown in FIG. 13 are intended to be illustrative only and that computing nodes 1302 and cloud computing environment 1300 can communicate with any type of computerized device over any type of network and/or network addressable connection (e.g., using a web browser).

Figure 14:
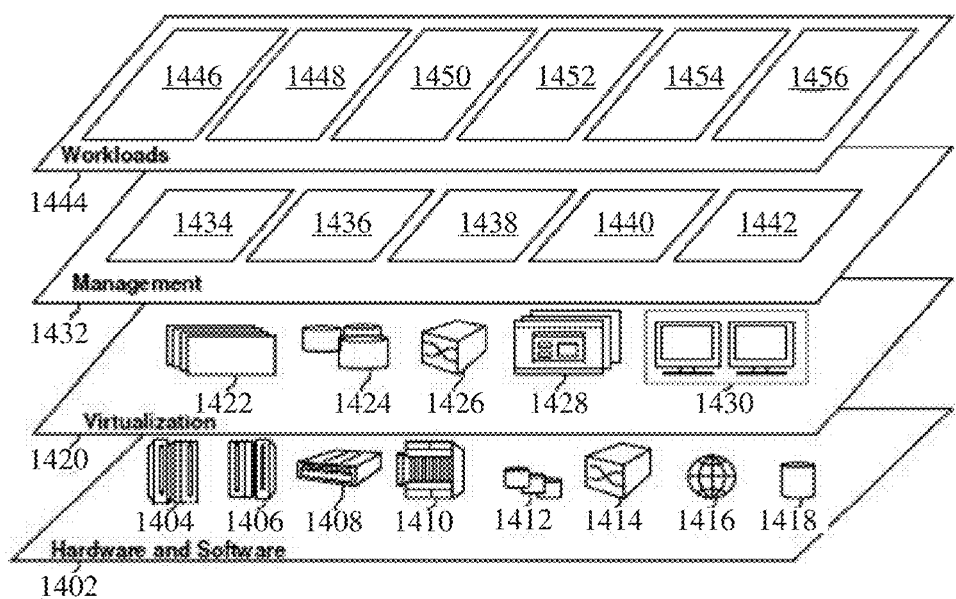
FIG. 14 illustrates example, non-limiting abstraction model layers in accordance with one or more embodiments described herein.

Referring now to FIG. 14, a set of functional abstraction layers provided by cloud computing environment 1300 (FIG. 13) is shown. Repetitive description of like elements employed in other embodiments described herein is omitted for sake of brevity. It should be understood in advance that the components, layers, and functions shown in FIG. 14 are intended to be illustrative only and embodiments of the invention are not limited thereto. As depicted, the following layers and corresponding functions are provided.

Hardware and software layer 1402 includes hardware and software components. Examples of hardware components include: mainframes 1404; RISC (Reduced Instruction Set Computer) architecture based servers 1406; servers 1408; blade servers 1410; storage devices 1412; and networks and networking components 1414. In some embodiments, software components include network application server software 1416 and database software 1418.

Virtualization layer 1415 provides an abstraction layer from which the following examples of virtual entities may be provided: virtual servers 1422; virtual storage 1424; virtual networks 1426, including virtual private networks; virtual applications and operating systems 1428; and virtual clients 1430.

In one example, management layer 1432 may provide the functions described below. Resource provisioning 1434 provides dynamic procurement of computing resources and other resources that are utilized to perform tasks within the cloud computing environment. Metering and Pricing 1436 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1438 provides access to the cloud computing environment for consumers and system administrators. Service level management 1440 provides cloud computing resource allocation and management such that required service levels are met. Service Level Agreement (SLA) planning and fulfillment 1442 provide pre-arrangement for, and procurement of, cloud computing resources for which a future requirement is anticipated in accordance with an SLA.

Workloads layer 1444 provides examples of functionality for which the cloud computing environment may be utilized. Examples of workloads and functions which may be provided from this layer include: mapping and navigation 1446; software development and lifecycle management 1448; virtual classroom education delivery 1450; data analytics processing 1452; transaction processing 1454; and differentially private federated learning processing 1456. Various embodiments of the present invention can utilize the cloud computing environment described with reference to FIGS. 13 and 14 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a standalone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on standalone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:

a processor that executes computer-executable components stored in a computer-readable memory, the computer-executable components comprising:

a detection component that detects a quantum state leakage associated with one or more qubits;

a pause component that, in response to detecting the quantum state leakage, generates a time pause prior to execution of a quantum circuit on the one or more qubits;

wherein the detection component performs one or more quantum state measurements on the one or more qubits during the time pause, wherein the one or more quantum state measurements binarily distinguish between a ground state and excited states; and an execution component that initiates, during the time pause, execution of the quantum circuit on the one or more qubits in response to the one or more quantum state measurements indicating that the one or more qubits are in the ground state.

2. The system of claim 1, wherein the pause component generates the time pause after execution of a previous quantum circuit on the one or more qubits, wherein the quantum state leakage arises during the execution of the previous quantum circuit, and wherein the quantum state leakage decays during the time pause.

3. The system of claim 1, wherein the one or more quantum state measurements further distinguish between different levels of the excited states, having a first excited state at a lowest level of the different levels.

4. The system of claim 3, wherein the execution component initiates, during the time pause, the execution of the quantum circuit on the one or more qubits in response to the one or more quantum state measurements indicating that the one or more qubits are in at least one of the ground state or the first excited state.

5. The system of claim 1, wherein the pause component varies a duration of the time pause based on a maximum excited state detected by the detection component.

6. The system of claim 1, wherein a duration of the time pause is greater than a coherence time of the one or more qubits.

7. The system of claim 6, wherein the duration of the time pause is of a same order of magnitude as the coherence time of the one or more qubits.

8. A computer-implemented method, comprising:

detecting, by a device operatively coupled to a processor, a quantum state leakage associated with one or more qubits;

generating, by the device and in response to detecting the quantum state leakage, a time pause prior to execution of a quantum circuit on the one or more qubits;

performing, by the device, one or more quantum state measurements on the one or more qubits during the time pause, wherein the one or more quantum state measurements binarily distinguish between a ground state and excited states; and initiating, by the device, during the time pause, execution of the quantum circuit on the one or more qubits in response to the one or more quantum state measurements indicating that the one or more qubits are in the ground state.

9. The computer-implemented method of claim 8, wherein the generating the time pause occurs after execution of a previous quantum circuit on the one or more qubits, wherein the quantum state leakage arises during the execution of the previous quantum circuit, and wherein the quantum state leakage decays during the time pause.

10. The computer-implemented method of claim 8, wherein the one or more quantum state measurements further distinguish between different levels of the excited states, having a first excited state at a lowest level of the different levels.

11. The computer-implemented method of claim 10, wherein the initiating comprises initiating, during the time pause, the execution of the quantum circuit on the one or more qubits in response to the one or more quantum state measurements indicating that the one or more qubits are in at least one of the ground state or the first excited state.

12. The computer-implemented method of claim 8, further comprising:

varying, by the device, a duration of the time pause based on a maximum excited state detected during the detecting.

13. The computer-implemented method of claim 8, wherein a duration of the time pause is greater than a coherence time of the one or more qubits.

14. The computer-implemented method of claim 13, wherein the duration of the time pause is of a same order of magnitude as the coherence time of the one or more qubits.

15. A computer program product for facilitating strategic pausing for quantum state leakage mitigation, the computer program product comprising a computer-readable memory having program instructions embodied therewith, the program instructions executable by a processor to cause the processor to:

detect, by the processor, a quantum state leakage associated with one or more qubits; and generate, by the processor and in response to detecting the quantum state leakage, a time pause prior to execution of a quantum circuit on the one or more qubits;

perform, by the processor, one or more quantum state measurements on the one or more qubits during the time pause, wherein the one or more quantum state measurements binarily distinguish between a ground state and excited states; and initiate, by the processor, during the time pause, execution the quantum circuit on the one or more qubits in response to the one or more quantum state measurements indicating that the one or more qubits are in the ground state.

16. The computer program product of claim 15, wherein the processor generates the time pause after execution of a previous quantum circuit on the one or more qubits, wherein the quantum state leakage arises during the execution of the previous quantum circuit, and wherein the quantum state leakage decays during the time pause.

17. The computer program product of claim 15, wherein the the one or more quantum state measurements further distinguish between different levels of the excited states, having a first excited state at a lowest level of the different levels.

18. The computer program product of claim 17, wherein the program instructions are further executable to cause the processor to:

initiate, by the processor, during the time pause, the execution of the quantum circuit on the one or more qubits in response to the one or more quantum state measurements indicating that the one or more qubits are in at least one of the ground state or the first excited state.

19. The computer program product of claim 15, wherein the program instructions are further executable to cause the processor to:

vary, by the processor, a duration of the time pause based on a maximum excited state detected by the processor.

20. The computer program product of claim 15, wherein a duration of the time pause is greater than a coherence time of the one or more qubits, and wherein the duration of the time pause is of a same order of magnitude as the coherence time of the one or more qubits.

* * * * *